(12) United States Patent
Smirnov

(10) Patent No.: US 7,016,547 B1
(45) Date of Patent: Mar. 21, 2006

(54) ADAPTIVE ENTROPY ENCODING/DECODING FOR SCREEN CAPTURE CONTENT

(75) Inventor: Sergey Smirnov, Redmond, WA (US)

(73) Assignee: Microsoft Corporation, Redmond, WA (US)

(*) Notice: Subject to any disclaimer, the term of this patent is extended or adjusted under 35 U.S.C. 154(b) by 768 days.

(21) Appl. No.: 10/186,639

(22) Filed: Jun. 28, 2002

(51) Int. Cl.
*G06K 9/36* (2006.01)

(52) U.S. Cl. .................. 382/245; 382/166; 382/232; 382/233

(58) Field of Classification Search .............. 382/162, 382/166, 209, 218, 219, 173, 244, 232, 233, 382/234, 245; 341/87, 106, 55, 67; 345/545, 345/538; 375/240.1, 241, 253; 719/328; 358/426.13
See application file for complete search history.

(56) References Cited

U.S. PATENT DOCUMENTS

| | | | |
|---|---|---|---|
| 4,698,672 A | 10/1987 | Chen | |
| 4,813,056 A | 3/1989 | Fedele | |
| 4,901,075 A | 2/1990 | Vogel | |
| 5,043,919 A | 8/1991 | Callaway et al. | |
| 5,089,818 A | 2/1992 | Mahieux et al. | |
| 5,128,758 A | 7/1992 | Azadegan | |
| 5,179,442 A | 1/1993 | Azadegan | |
| 5,227,788 A | 7/1993 | Johnston | |
| 5,266,941 A | 11/1993 | Akeley et al. | |
| 5,394,170 A | 2/1995 | Akeley et al. | |
| 5,400,075 A | 3/1995 | Savatier | |
| 5,457,495 A | 10/1995 | Hartung | |
| 5,461,421 A | 10/1995 | Moon | |
| 5,467,134 A | 11/1995 | Laney | |
| 5,481,553 A | 1/1996 | Suzuki | |
| 5,504,591 A | 4/1996 | Dujari | |
| 5,544,286 A | 8/1996 | Laney | |
| 5,559,557 A | 9/1996 | Kato et al. | |
| 5,579,430 A | 11/1996 | Grill et al. | |
| 5,654,706 A | 8/1997 | Jeong et al. | |
| 5,661,755 A | 8/1997 | Van de Kerkhof | |
| 5,717,821 A | 2/1998 | Tsutsui | |

(Continued)

FOREIGN PATENT DOCUMENTS

EP    0540350    5/1993

(Continued)

OTHER PUBLICATIONS

Brandenburg, "ASPEC CODING", *AES 10$^{th}$ International Conference*, pp. 81-90 (1991).

(Continued)

*Primary Examiner*—Anh Hong Do
(74) *Attorney, Agent, or Firm*—Klarquist Sparkman, LLP

(57) ABSTRACT

Adaptive entropy encoding and decoding techniques are described. For example, a screen capture encoder and decoder perform adaptive entropy encoding and decoding of palettized screen capture content in screen capture video. The encoder selects between different entropy encoding modes (such as an arithmetic coding mode and a combined run length/Huffman encoding mode, which allow the encoder to emphasize bitrate reduction at some times and encoding speed at other times). The run length encoding can use run value symbols adapted to common patterns of redundancy in the content. When the encoder detects series of pixels that could be encoded with different, alternative runs, the encoder selects between the alternative runs based upon efficiency criteria. The encoder also performs adaptive Huffman encoding, efficiently parameterizing Huffman code tables to reduce overall bitrate while largely preserving the compression gains of the adaptive Huffman encoding. A decoder performs converse operations.

15 Claims, 19 Drawing Sheets

U.S. PATENT DOCUMENTS

| | | | |
|---|---|---|---|
| 5,825,830 | A | 10/1998 | Kopf |
| 5,835,144 | A | 11/1998 | Matsumura |
| 5,883,633 | A | 3/1999 | Gill et al. |
| 5,982,437 | A | 11/1999 | Okazaki |
| 5,990,960 | A | 11/1999 | Murakami |
| 5,995,670 | A | 11/1999 | Zabinsky |
| 6,002,439 | A | 12/1999 | Murakami |
| 6,054,943 | A * | 4/2000 | Lawrence ............... 341/87 |
| 6,097,759 | A | 8/2000 | Murakami |
| 6,100,825 | A | 8/2000 | Sedluk |
| 6,111,914 | A | 8/2000 | Bist |
| 6,148,109 | A | 11/2000 | Boon |
| 6,215,910 | B1 | 4/2001 | Chaddha |
| 6,223,162 | B1 | 4/2001 | Chen |
| 6,226,407 | B1 * | 5/2001 | Zabih et al. ............ 382/209 |
| 6,233,017 | B1 | 5/2001 | Chaddha |
| 6,253,165 | B1 | 6/2001 | Malvar |
| 6,292,588 | B1 | 9/2001 | Shen |
| 6,300,888 | B1 | 10/2001 | Chen |
| 6,304,928 | B1 | 10/2001 | Mairs et al. |
| 6,337,881 | B1 | 1/2002 | Chaddha |
| 6,341,165 | B1 | 1/2002 | Gbur |
| 6,345,123 | B1 | 2/2002 | Boon |
| 6,377,930 | B1 | 4/2002 | Chen |
| 6,404,931 | B1 | 6/2002 | Chen |
| 6,421,738 | B1 * | 7/2002 | Ratan et al. ............ 719/328 |
| 6,477,280 | B1 | 11/2002 | Malvar |
| 6,542,631 | B1 * | 4/2003 | Ishikawa ............... 382/162 |
| 6,573,915 | B1 * | 6/2003 | Sivan et al. ............ 715/781 |
| 6,646,578 | B1 | 11/2003 | Au |
| 6,721,700 | B1 | 4/2004 | Yin |
| 6,728,317 | B1 | 4/2004 | Demos |
| 6,766,293 | B1 | 7/2004 | Herre |
| 6,771,777 | B1 | 8/2004 | Gbur |
| 2004/0136457 | A1 | 7/2004 | Funnell et al. |

FOREIGN PATENT DOCUMENTS

| | | |
|---|---|---|
| EP | 0910927 | 1/1998 |
| EP | 0966793 | 9/1998 |
| EP | 0931386 | 1/1999 |
| JP | 5-292481 | 11/1993 |
| JP | 7-274171 | 10/1995 |

OTHER PUBLICATIONS

De Agostino et al., "Parallel Algorithms for Optimal Compression using Dictionaries with the Prefix Property," in *Proc. Data Compression Conference '92, IEEE Computer Society Press*, pp. 52-62 (1992).

Gill et al., "Creating High-Quality Content with Microsoft Windows Media Encoder 7," 4 pp. (2000). [Downloaded from the World Wide Web on May 1, 2002].

Li et al., "Optimal Linear Interpolation Coding for Server-Based Computing," *Proc. IEEE Int'l Conf. on Communications*, 5 pp. (Apr.-May 2002).

Matthias, "An Overview of Microsoft Windows Media Screen Technology," 3 pp. (2000). [Downloaded from the World Wide Web on May 1, 2002].

Palmer et al., "Shared Desktop: A Collaborative Tool for Sharing 3-D Applications Among Different Window Systems," *Digital Tech. Journal*, v. 9, No. 3, pp. 42-49 (1997).

OPTX International, "OPTX Improves Technology-Based Training with Screen Watch™ 3.0. Versatile Screen Capture Software Adds High Color and Live Webcast Support," 1 p., document marked Feb. 15, 2001 [downloaded from the World Wide Web on Sep. 22, 2005].

OPTX International, "OPTX International Marks One Year Anniversary of Screen Watch With Release of New 2.0 Version," 1 p., document marked May 16, 2000 [downloaded from the World Wide Web on Sep. 22, 2005].

OPTX International, "New Screen Watch™ 4.0 Click and Stream™ Wizard From OPTX International Makes Workplace Communication Effortless," 1 p., document marked Sep. 24, 2001, [downloaded from the World Wide Web on Sep. 22, 2005].

Schaar-Mitrea et al., "Hybrid Compression of Video with Graphics in DTV Communication Systems," *IEEE Trans. on Consumer Electronics*, pp. 1007-1017 (2000).

Shamoon et al., "A Rapidly Adaptive Lossless Compression Algorithm for High Fidelity Audio Coding," *IEEE Data Compression Conf. 1994*, pp. 430-439 (Mar. 1994).

Techsmith Corporation, "Techsmith Camtasia Screen Recorder SDK," 2 pp. (2001).

Techsmith Corporation, "Camtasia Feature of the Week: Quick Capture," 2 pp. (Downloaded from the World Wide Web on May 9, 2002; document dated Jan. 4, 2001).

Techsmith Corporation, "Camtasia Screen Recorder SDK DLL API User Guide," version 1.0, 66 pp. (2001).

Techsmith Corporation, "Camtasia v3.0.1—README. TXT,", 19 pp. (Jan. 2002).

* cited by examiner

Figure 1, Prior Art

Software 280 Implementing Adaptive Screen Capture
Entropy Encoder and/or Decoder

```
// Deterministically assign codes based on an incomplete code length table
void GenerateVLCArray(CodeLen* codeLen, int nReservedSyms, int* vlcArray, int nSyms) {
    int iSym, len, nextAvail, nOtherSyms;

*vlcArray++ = nSyms;
    for (iSym = 0; iSym < nSyms; iSym++) vlcArray[iSym * 2 + 1] = 0;

// assign codes according to the code length table
    nextAvail = 0;
    len = 1;
    for (iSym = 0; iSym < nReservedSyms; iSym++) {
        if (codeLen[iSym].len != len) {
            nextAvail <<= (codeLen[iSym].len - len);
            len = codeLen[iSym].len;
        }
        vlcArray[codeLen[iSym].sym * 2] = nextAvail++;
        vlcArray[codeLen[iSym].sym * 2 + 1] = len;
        Assert(nextAvail < (1 << len));
    }

// assign (almost) equal length codes for symbols not in the table
    nOtherSyms = nSyms - nReservedSyms;
    int nExcessCodes;
    do {
        len++;
        nextAvail <<= 1;
        nExcessCodes = (1 << len) - nextAvail - nOtherSyms;
    } while (nExcessCodes < 0);
    Assert(nExcessCodes < nOtherSyms);
    for (iSym = 0; iSym < nSyms; iSym++) if (vlcArray[iSym * 2 + 1] == 0) {
        if (nExcessCodes) { // use shorter codes while they last
            vlcArray[iSym * 2] = nextAvail >> 1;
            vlcArray[iSym * 2 + 1] = len - 1;
            nextAvail += 2;
            nExcessCodes--;
        } else {
            vlcArray[iSym * 2] = nextAvail++;
            vlcArray[iSym * 2 + 1] = len;
        }
    }
    Assert(nextAvail == (1 << len)); // should be all used up at this point
}
```

ADAPTIVE ENTROPY ENCODING/DECODING FOR SCREEN CAPTURE CONTENT

FIELD

The present invention relates to adaptive encoding and decoding of screen capture content. For example, a screen capture encoder adaptively switches between different entropy encoding modes for screen capture content, including a mode in which the encoder uses adaptive run length encoding followed by adaptive Huffman encoding.

RELATED APPLICATION DATA

The following concurrently filed U.S. patent applications relate to the present application: 1) U.S. patent application Ser. No. 10/186,481, entitled, "Rate Allocation for Mixed Content Video," filed Jun. 28, 2002, the disclosure of which is hereby incorporated by reference; 2) U.S. patent application Ser. No. 10/186,473, entitled, "Motion Estimation/Compensation for Screen Capture Video," filed Jun. 28, 2002, the disclosure of which is hereby incorporated by reference; and 3) U.S. patent application Ser. No. 10/186,887, entitled, "Text Detection in Continuous Tone Image Segments," filed Jun. 28, 2002, the disclosure of which is hereby incorporated by reference.

BACKGROUND

A screen capture tool lets a computer user record an image displayed on a visual display unit such as a computer monitor. The user might use the captured screen area (alternatively called a screen area, screen image, screen shot, screen frame, screen region, capture area, capture image, capture shot, etc.) in a help manual or report to show the results displayed on the display unit at a particular time. For some applications, a user captures a series of screen areas to show how screen content changes. The user might use the series of captured screen areas within an instructional video for job training or remote instruction.

FIG. 1 is a captured screen area (100) of a computer desktop environment according to the prior art. The captured screen area (100) shows the entire desktop, but could instead show only the window (130) or some other portion of the desktop. A cursor graphic (140) overlays the window (130), and several icon graphics (120, 122, 124) overlay the background (110). The captured screen area (100) could be part of a series. Through the series, much of the screen content in the captured screen area (100) would probably remain the same. Screen content such as the background (110) and icon graphics (120, 122, 124) usually does not change from frame to frame. On the other hand, the cursor graphic (140) often changes position and shape as the user manipulates a mouse or other input device, and the contents of the window (130) often change as a user types, adds graphics, etc.

Like other forms of digital video, screen capture video consumes large amounts of storage and transmission capacity. Many computers and computer networks lack the resources to store and transmit raw screen capture video. For this reason, engineers often use compression (also called coding or encoding) to reduce the bitrate of screen capture video. Decompression reverses compression. To understand how compression and decompression relate to quality and bitrate, it helps to understand how a computer represents screen areas.

I. Computer Representation of Captured Screen Areas

A single rectangular captured screen area includes rows of picture elements ["pixels"] with color values. The resolution of the captured screen area depends on the number of pixels and the color depth. The number of pixels is conventionally expressed in terms of the dimensions of the rectangle, for example, 320×240 or 800×600. The color depth is conventionally expressed as a number of bits per pixel, for example, 1, 8, 16, 24 or 32, which affects the number of possible colors for an individual pixel. If the color depth is 8 bits, for example, there are $2^8=256$ possible colors per pixel, which can be shades of gray or indices to a color palette that stores 256 different 24-bit colors in the captured screen area. A given series of captured screen areas can include pixels with different color depths, as described below.

The frame rate of a series of captured screen areas (i.e., the resolution in time) is conventionally expressed in terms of frames per second ["fps"]. Some conventional frame rates are 1, 2, 10, 15, 25, and 30 fps. A higher frame rate generally results in smoother playback of changing screen content.

Quality affects the number of bits needed to represent a series of captured screen areas, which in turn affects the costs of capturing, processing, storing, and transmitting the series. For example, the bitrate for an uncompressed 2 fps series of 320×240 pixel frames with 8-bit pixels is more than 1 million bits per second. The bitrate for an uncompressed 10 fps series of 800×600 pixel frames with 24-bit pixels is more than 115 million bits per second.

Screen capture images may contain a mixture of continuous tone content and palettized content. Continuous tone content includes, for example, photographs or other images with gradually varying colors or tones, and typically uses a range of image tones that appears substantially continuous to the human eye. Palettized content includes, for example, icons, toolbars, and command or notepad windows consisting of a flat color background and foreground text of a contrasting color. A color palette typically includes a relatively small set of image colors or tones (e.g., 256 different 24-bit colors). Palettized content often includes areas of perceptually important fine detail—spatially localized, high frequency variations depicting text elements or other image discontinuities.

II. Compression and Decompression of Screen Capture Video

Since a series of captured screen areas can have a very high bitrate, there can be performance bottlenecks at the points of storing the series or transmitting the series across a network. Compression of captured screen areas is often used to address these performance bottlenecks by decreasing bitrate. Compression can be lossless, in which quality of the video does not suffer but decreases in bitrate are limited by the complexity of the video. Or, compression can be lossy, in which quality of the video suffers but decreases in bitrate are more dramatic.

Applying lossy compression to palettized content can result in the loss of perceptually important fine detail. For example, text and sharp edges may be blurred or distorted in the decompressed content. As a result, lossless encoding of palettized content is preferred in many circumstances. On the other hand, while it is desirable to encode continuous tone content using only lossless compression if sufficient resources are available, lossy compression can be used in a conventional camera video encoder in some systems to effectively compress continuous tone content at a lower bitrate. The lossy compression, however, can introduce unacceptable distortion in palettized content mixed with the continuous tone content.

Some encoding tools allow compression of screen capture video with any of multiple encoders on a system. The multiple encoders can include, for example, conventional video encoders designed for camera video and screen capture encoders designed for screen capture video.

A. Conventional Video Encoders Designed for Camera Video

Conventional video encoders designed for camera video use a variety of different compression techniques. Commonly, these compression techniques involve frequency transforms, quantization, and entropy encoding for individual frames, and motion estimation for series of frames. The compression techniques can include run length encoding and Huffman encoding.

Run length encoding is simple, well-known compression technique used for camera video, audio, text, and other types of content. In general, run length encoding replaces a sequence (i.e., run) of consecutive symbols having the same value with the value and the length of the sequence. In run length decoding, the sequence of consecutive symbols is reconstructed from the run value and run length. Numerous variations of run length encoding/decoding have been developed. For additional information about run length encoding/decoding and some of its variations, see, e.g., Bell et al., *Text Compression*, Prentice Hall PTR, pages 105–107, 1990; Gibson et al., *Digital Compression for Multimedia*, Morgan Kaufmann, pages 17–62, 1998; U.S. Pat. No. 5,467,134 to Laney et al.; U.S. Pat. No. 6,304,928 to Mairs et al.; U.S. Pat. No. 5,883,633 to Gill et al.; and U.S. Pat. No. 6,233,017 to Chen et al.

The results of run length encoding (e.g., the run values and run lengths) can be Huffman encoded to further reduce bitrate. If so, the Huffman encoded data is Huffman decoded before run length decoding.

Huffman encoding is another well-known compression technique used for camera video, audio, text, and other types of content. In general, a Huffman code table associates variable length, Huffman codes with unique symbol values. Shorter codes are assigned to more probable symbol values, and longer codes are assigned to less probable symbol values. The probabilities are computed for typical examples of some kind of content. Or, the probabilities are computed for data just encoded or data to be encoded, in which case the Huffman codes adapt to changing probabilities for the unique symbol values. Compared to static Huffman coding, adaptive Huffman coding usually reduces the bitrate of compressed data by incorporating more accurate probabilities for the data, but extra information specifying the Huffman codes may also need to be transmitted.

To encode symbols, the Huffman encoder replaces symbol values with the variable length, Huffman codes associated with the symbol values in the Huffman code table. To decode, the Huffman decoder replaces the Huffman codes with the symbol values associated with the Huffman codes. Numerous variations of Huffman encoding/decoding have been developed. For additional information about Huffman encoding/decoding and some of its variations, see, e.g., Bell et al., *Text Compression*, Prentice Hall PTR, pages 105–107, 1990; Gibson et al., *Digital Compression for Multimedia*, Morgan Kaufmann, pages 17–62, 1998; and Deutsch, "RFC 1951: DEFLATE Compressed Data Format Specification," Internet Engineering Task Force, May 1996.

B. Screen Capture Encoders Designed for Screen Capture Video

Screen capture encoders use a variety of different techniques to compress screen capture video. Because screen content often includes palettized content, many screen capture encoders use lossless compression.

One prior art screen capture encoder segments pixels of palettized screen capture content into rectangles of more or less internally consistent regions, then losslessly compresses the pixels of the regions with an arithmetic coder. Using a technique called context color coding, the arithmetic coder recognizes patterns in the pixels and uses the patterns to predict more probable/less probable color values during arithmetic coding, which can lower the bitrate for the pixels. For more information about this technique, see U.S. patent application Ser. No. 09/577,544, filed May 24, 2000, entitled "Palettized Image Compression," the disclosure of which is hereby incorporated by reference.

The main goal of the prior art screen capture encoder is to reduce the bitrate for pixels of palettized content. When applied to other kinds of content, the segmentation can create too many regions and take too long (e.g., if there are not large regions of relatively homogenous content), and the arithmetic coding can be inefficient due to poor prediction and an increased number of unique patterns in the pixels. Even when encoding only palettized content, the encoder generally succeeds at reducing bitrate, but encoding time can vary widely. For a frame of simple content, the encoding time is consistently short (e.g., 0.1 second). For a frame of complex or gradually varying palettized content, however, the encoding time can be unpredictable and/or long (e.g., 1.5 seconds). In some applications, this is unacceptable. For example, for real time streaming of screen capture video, the unpredictable encoding time can disrupt encoding by suddenly overloading the processor or adding overall delay.

SUMMARY

The present invention relates to adaptive entropy encoding and decoding. For example, a screen capture encoder performs adaptive entropy encoding and decoding of screen capture video, which improves the efficiency of compression of the screen capture video in a wide variety of scenarios. The present invention includes several different techniques and tools, which can be used in combination or separately.

First, an encoder such as a screen capture encoder selects between different entropy encoding modes for palettized screen capture content. For example, the encoder switches between arithmetic coding and combined run length/Huffman encoding, which allows the encoder to emphasize bitrate reduction at some times and encoding speed at other times. During decoding, a decoder such as a screen capture decoder selects between different entropy decoding modes for the palettized screen capture content.

Second, an encoder such as a screen capture encoder performs run length encoding that is adapted to palettized screen capture content. This reduces bitrate while still providing fast performance. For example, the encoder uses run value symbols adapted to patterns of redundancy common in palettized screen capture content. Or, the encoder detects when series of pixels could be encoded with different, alternative runs, then selects between the alternative runs based upon efficiency criteria. During decoding, a decoder such as a screen capture decoder performs corresponding run length decoding. Alternatively, an encoder or decoder performs the run length encoding or decoding techniques on another kind of content.

Third, an encoder such as a screen capture encoder performs adaptive Huffman encoding on run length encoded palettized screen capture content. The encoder efficiently parameterizes Huffman code tables to reduce overall bitrate, while largely preserving the compression gains of adaptive Huffman encoding. During decoding, a decoder such as a screen capture decoder reconstructs a Huffman code table from parameters provided by the encoder, then performs Huffman decoding. Alternatively, an encoder or decoder constructs Huffman code tables for adaptive Huffman encoding or decoding for another kind of content.

Additional features and advantages will be made apparent from the following detailed description of various embodiments that proceeds with reference to the accompanying drawings.

BRIEF DESCRIPTION OF THE DRAWINGS

FIG. 15 is a code listing showing code for reconstructing a Huffman code table from a code count and code lengths for a subset of the codes in the table.

DETAILED DESCRIPTION

Figure 1:
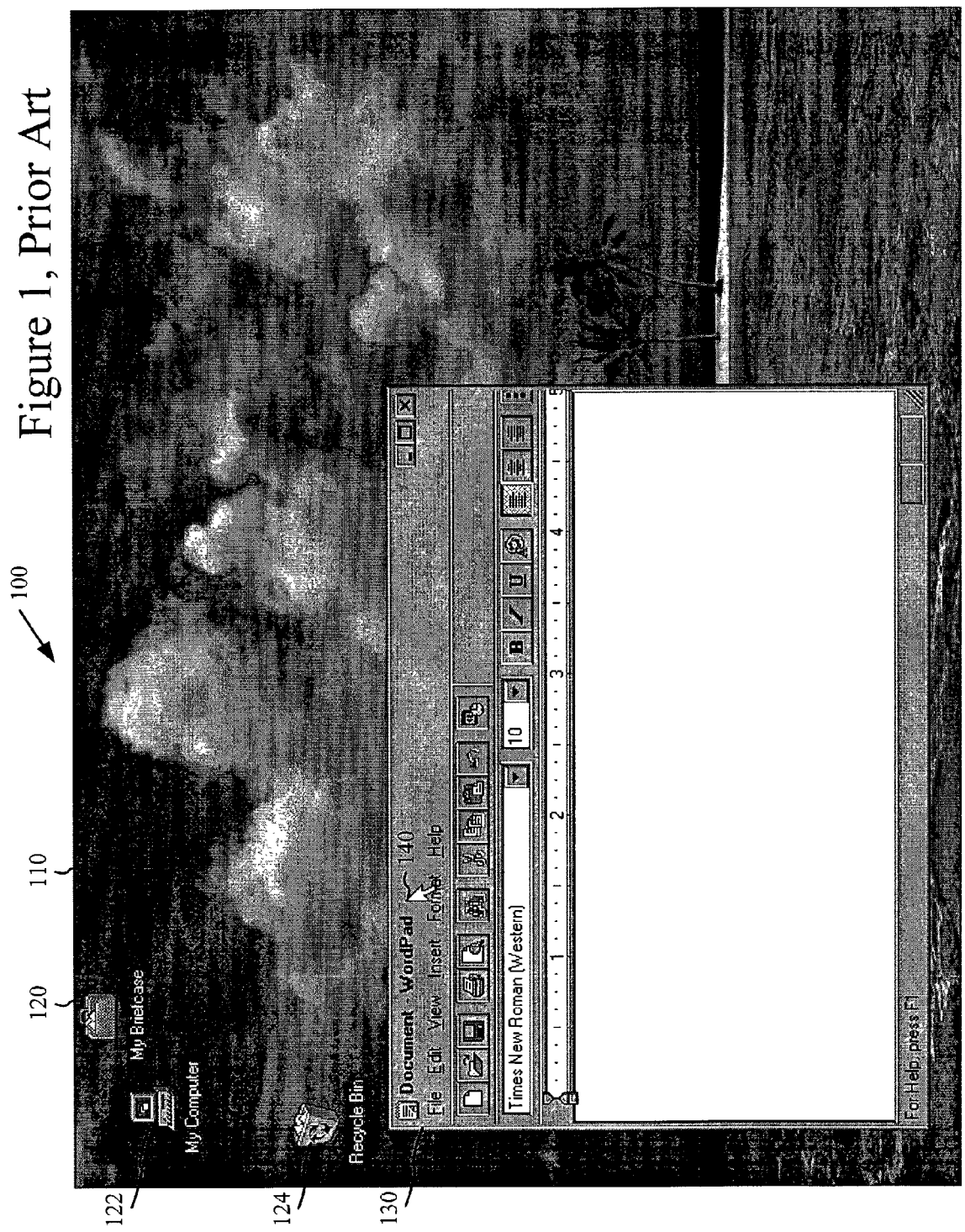
FIG. 1 is a captured screen area of a computer desktop environment according to the prior art.

Described embodiments are directed to adaptive entropy encoding and decoding techniques. In particular, several of the following sections describe a screen capture encoder and decoder that performs adaptive entropy encoding and decoding for screen capture video. In a wide variety of encoding scenarios for screen capture video, these techniques improve the efficiency of compression.

The screen capture encoder adaptively switches between two different entropy encoding modes for palettized screen capture content. In the first mode, the encoder uses context-based arithmetic coding to reduce bitrate for the palettized screen capture content under normal operating conditions. When the processor becomes overloaded or encoding takes too long, the encoder switches to a variation of run length and Huffman encoding adapted to palettized screen capture content. This allows the encoder to emphasize bitrate reduction at some times and encoding speed at other times. The encoding time for the adapted run length/Huffman encoding is consistent and fast for various types of palettized screen capture content. On the other hand, bitrate reduction is rarely as dramatic as with the arithmetic coding.

In several respects, the adapted run length/Huffman encoding used by the screen capture encoder is well suited for palettized screen capture content. The screen capture encoder consistently achieves better compression (lower bitrate) than it would with other run length/Huffman encoding techniques. At the same time, the adapted run length/Huffman encoding retains the predictable and fast performance that characterizes run length encoding.

In the run length encoding adapted to palettized screen capture content, the screen capture encoder encodes runs of color value symbols, above symbols, and/or previous frame symbols. For a given pixel in a row of a frame, a color value symbol can indicate the color value (e.g., the index to a color palette, or the color component value(s) in some color space) for the given pixel, an above symbol can reference the color value of the pixel just above the given pixel, or a previous frame symbol can reference the color value of the pixel at the same location as the given pixel but in the previous frame. Some runs can be run length encoded only with the color value symbols for the runs. On the other hand, in some cases, a particular series of pixels might instead be encoded with the above symbol and/or the previous frame symbol. If so, the encoder evaluates the efficiency of using the different types of run values. For example, the encoder checks the length of a run with the color value symbol and checks the length of an alternative run with the above symbol, then uses the run value that results in the longer run.

For adaptive Huffman encoding, the screen capture encoder assigns Huffman codes to run values and run lengths resulting from run length encoding. In particular, for a subset of the most probable symbol values (i.e., for run values or run lengths), the encoder assigns Huffman codes with lengths substantially proportional to probability of occurrence of those most probable symbol values in the run length encoded content. For the other possible symbol values, the encoder assigns Huffman codes of substantially equal length, treating the probabilities for the other possible symbol values as substantially equal. To specify the Huffman code table to a decoder, the encoder transmits the number of Huffman codes in the subset and the lengths for those Huffman codes. This consumes much less bitrate than transmitting all of the Huffman codes or transmitting the lengths or probabilities for all of the Huffman codes.

The screen capture decoder performs the reverse of these techniques, switching between an arithmetic decoding mode and a Huffman/run length decoding mode. For the Huffman/run length decoding mode, the screen capture decoder reconstructs Huffman code tables from code counts and lengths transmitted by the encoder, then Huffman decodes the run length encoded data. The screen capture decoder then performs run length decoding of the selected runs.

The described embodiments include several different techniques and tools. While these techniques and tools are described as part of a single system, they can also be used separately, potentially in combination with other techniques and tools. Moreover, instead of a screen capture encoder or decoder, another type of encoder, decoder or tool can perform one or more of the techniques on palettized screen capture content or some other kind of content.

For the mode switching, for example, instead of or in addition to arithmetic coding/decoding and run length/Huffman encoding/decoding modes, an encoder or decoder can switch between other modes for entropy encoding or decoding palettized screen capture content. Or, instead of switching to tradeoff bitrate and encoding speed, an encoder or decoder can switch according to some other criteria.

For the run length encoding and decoding, for example, an encoder and decoder can use run values other than or in addition to color value symbols, above symbols, and previous frame symbols. Or, an encoder selects between alternative runs according to criteria other than run length, for run length encoded palettized screen capture content or some other kind of content.

For the adaptive Huffman encoding and decoding, for example, an encoder or decoder can construct a Huffman code table from other parameters describing a subset of the Huffman codes in the table. Moreover, the adaptive Huffman encoding and decoding can be used for content other than run length encoding symbols.

I. Computing Environment

Figure 2:
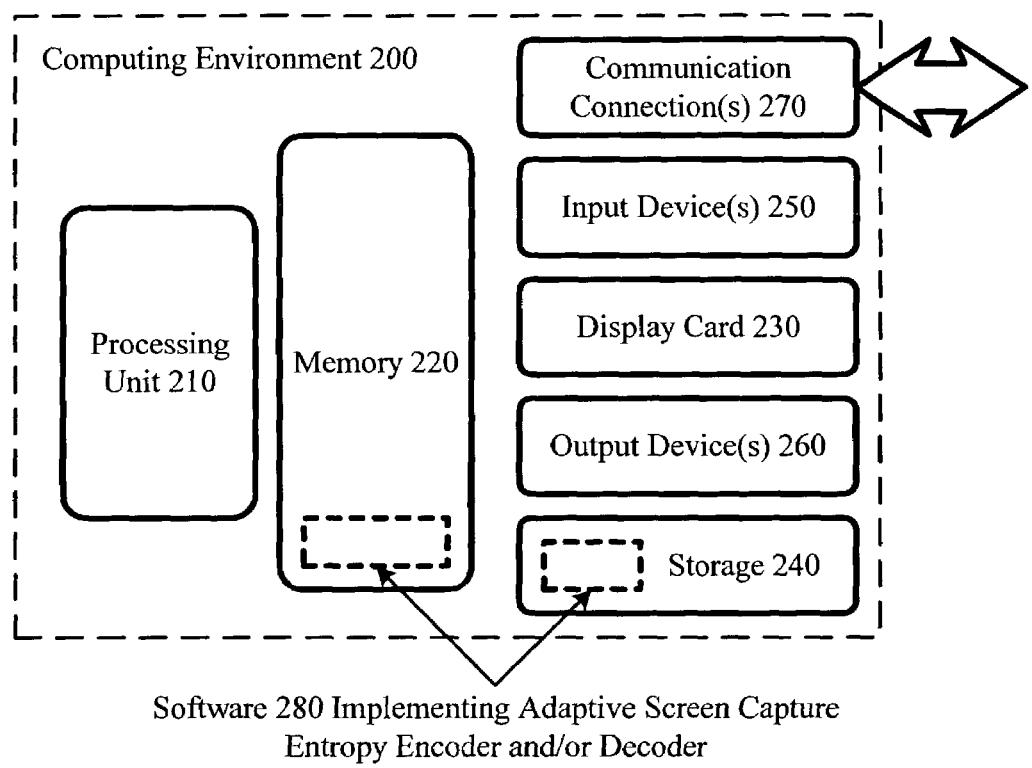
FIG. 2 is a block diagram of a suitable computing environment in which described embodiments may be implemented.

FIG. 2 illustrates a generalized example of a suitable computing environment (200) in which described embodiments may be implemented. The computing environment (200) is not intended to suggest any limitation as to scope of use or functionality of the invention, as the present invention may be implemented in diverse general-purpose or special-purpose computing environments.

With reference to FIG. 2, the computing environment (200) includes at least one processing unit (210) and memory (220). The processing unit (210) executes computer-executable instructions and may be a real or a virtual processor. In a multi-processing system, multiple processing units execute computer-executable instructions to increase processing power. The memory (220) may be volatile memory (e.g., registers, cache, RAM), non-volatile memory (e.g., ROM, EEPROM, flash memory, etc.), or some combination of the two. The memory (220) stores software (280) implementing an adaptive screen capture entropy encoder and/or decoder.

The computing environment (200) also includes a display card (230). The display card (230) (alternatively called the video card, graphics card, graphics output device, display adapter, video graphics adapter, etc.) delivers output to a visual display unit such as a computer monitor. The display card (230) includes a frame buffer that stores pixel information for display on a screen. The frame buffer is often some type of RAM on the display card (230), but can instead be some other kind of memory and/or not physically located on the display card itself. The display card (230) can include a graphics processor, graphics accelerator, and/or other specialized display hardware.

Typically, operating system software (not shown) provides an operating environment for other software executing in the computing environment (200), and coordinates activities of the components of the computing environment (200). In addition, display driver software allows access to various features of the display card (230). The display driver software can work in conjunction with one or more layers of operating system software through which access to the features of the display card (230) is exposed. For example, through such features, a screen capture tool might retrieve pixel information from the frame buffer of the display card (230) for screen content currently displayed on a screen of a visual display unit.

A computing environment may have additional features. For example, the computing environment (200) includes storage (240), one or more input devices (250), one or more output devices (260), and one or more communication connections (270). An interconnection mechanism (not shown) such as a bus, controller, or network interconnects the components of the computing environment (200).

The storage (240) may be removable or non-removable, and includes magnetic disks, magnetic tapes or cassettes, CD-ROMs, CD-RWs, DVDs, or any other medium which can be used to store information and which can be accessed within the computing environment (200). The storage (240) stores instructions for the software (280) implementing an adaptive screen capture entropy encoder and/or decoder.

The input device(s) (250) may be a touch input device such as a keyboard, mouse, pen, or trackball, a voice input device, a scanning device, sound card, TV tuner/video input card, or other device that provides input to the computing environment (200).

The output device(s) (260) may be a visual display unit, printer, speaker, CD-writer, or other device that provides output from the computing environment (200). A visual display unit presents screen content based upon output delivered from the display card (230).

The communication connection(s) (270) enable communication over a communication medium to another computing entity. The communication medium conveys information such as computer-executable instructions, compressed captured screen area information, or other data in a modulated data signal. A modulated data signal is a signal that has one or more of its characteristics set or changed in such a manner as to encode information in the signal. By way of example, and not limitation, communication media include wired or wireless techniques implemented with an electrical, optical, RF, infrared, acoustic, or other carrier.

The invention can be described in the general context of computer-readable media. Computer-readable media are any available media that can be accessed within a computing environment. By way of example, and not limitation, with the computing environment (200), computer-readable media include memory (220), storage (240), communication media, and combinations of any of the above.

The invention can be described in the general context of computer-executable instructions, such as those included in program modules, being executed in a computing environment on a target real or virtual processor. Generally, program modules include routines, programs, libraries, objects, classes, components, data structures, etc. that perform particular tasks or implement particular abstract data types. The functionality of the program modules may be combined or split between program modules as desired in various implementations. Computer-executable instructions for program modules may be executed within a local or distributed computing environment.

For the sake of presentation, the detailed description uses terms like "detect," "select," "encode," and "decode" to describe computer operations in a computing environment. These terms are high-level abstractions for operations performed by a computer, and should not be confused with acts performed by a human being. The actual computer operations corresponding to these terms vary depending on implementation.

II. Exemplary Screen Capture Encoder and Decoder

Figure 3:
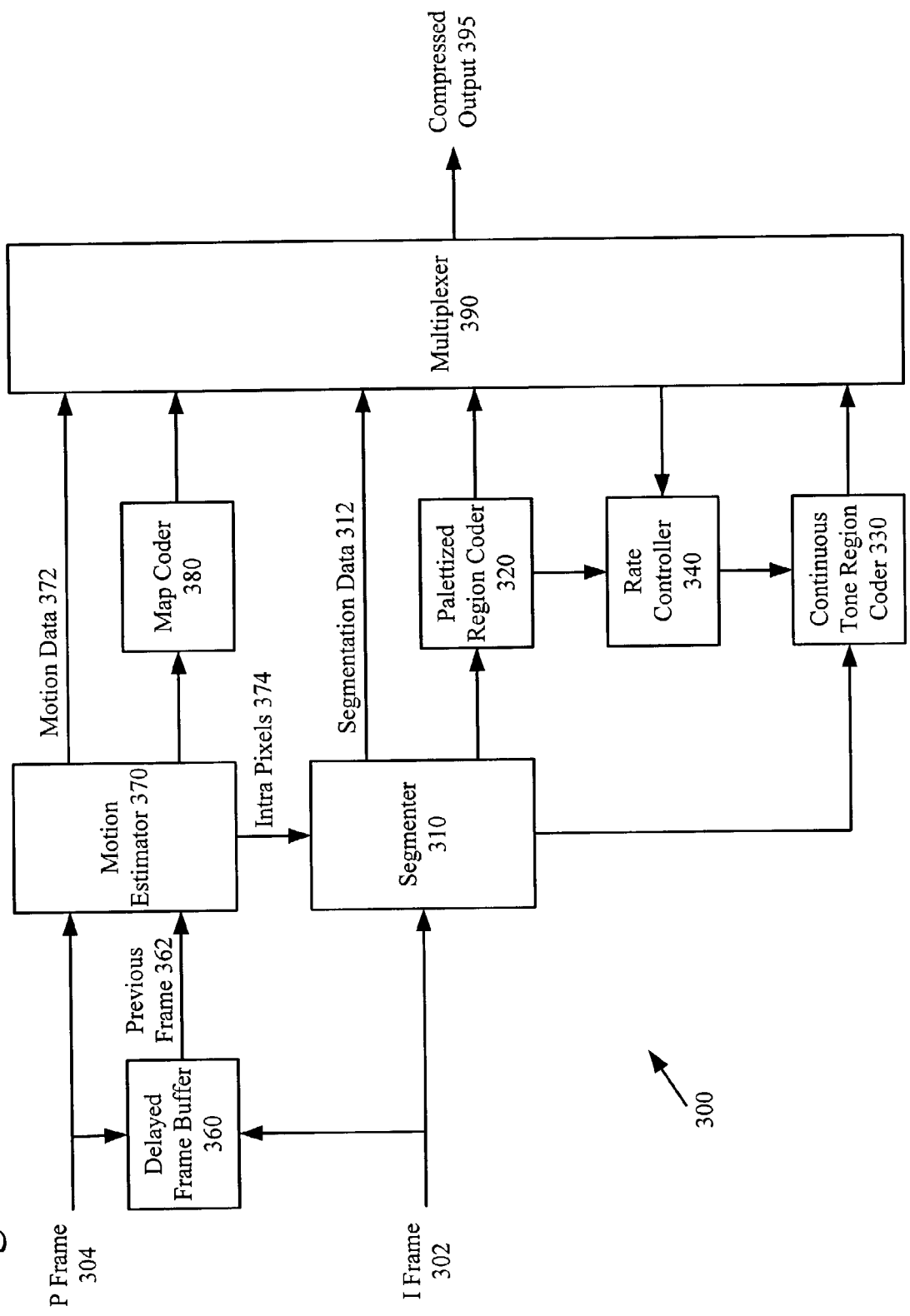
FIGS. 3 and 4 are block diagrams of an exemplary screen capture encoder and decoder, respectively, in which described embodiments may be implemented.
Figure 4:
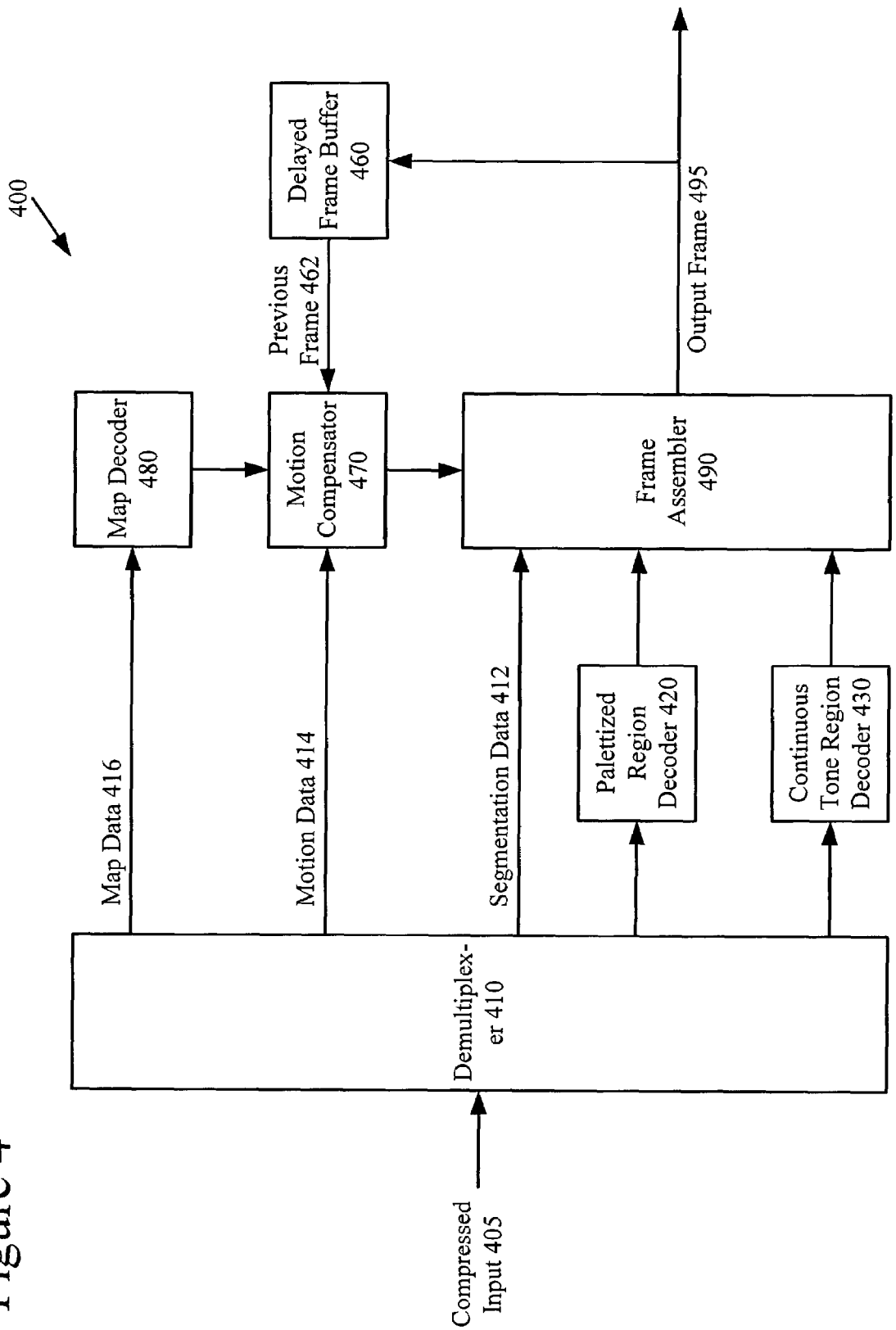

FIGS. 3 and 4 are block diagrams of an exemplary screen capture encoder (300) and an exemplary screen capture decoder (400), respectively. In various respects, the encoder (300) and decoder (400) are customized to compress/decompress frames of pixel information for screen areas captured from the screen of a visual display unit. Alternatively, the encoder (300) and decoder (400) compress/decompress frames of pixel information for other types of content.

In a common screen capture scenario, a screen capture module (not shown) captures screen areas that the encoder (300) compresses as a series of frames. The screen capture module can be a standalone software application, a feature of a multimedia production or encoding package, a plug-in, or some other form of product. The captured screen areas can show an entire screen (for example, an entire desktop environment), a selected window, or an arbitrary region of the desktop environment. In general, a screen area depicts some or all of the screen content presented or prepared for presentation in a desktop environment or other graphical user interface for a computer system. To capture a screen area, the screen capture module uses a Bit Block Transfer or other screen capture technique, such as one described in U.S. patent application Ser. No. 10/160,697, filed May 30, 2002, entitled "Reducing Information Transfer in Screen Capture Series," hereby incorporated by reference.

The screen capture module typically lets a user set high-level options for a capture session (e.g., media sources and types, quality, resultant bitrate, buffer size, and output stream or file location). The screen capture module can also present low-level options to the user, such as capture frame rate, output resolution, time distortion (e.g., slow motion). The capture frame rate for a series of screen areas may be fixed for the duration of the series or vary during screen capture for all or part of a screen area so as to increase temporal resolution when possible and decrease temporal resolution (even skipping frames) if necessary.

The relationships shown in FIGS. 3 and 4 indicate the main flow of information in the encoder and decoder; other relationships are not shown for the sake of simplicity. Depending on implementation and the type of compression/decompression desired, modules of the encoder or decoder can be added, omitted, split into multiple modules, combined with other modules, and/or replaced with like modules. In alternative embodiments (some of which are described below), an encoder or decoder includes different modules and/or other configurations of modules.

A. Exemplary Screen Capture Encoder

The exemplary screen capture encoder (300) includes a segmenter (310), a palettized region coder (320), a continuous tone region coder (330), a rate controller (340), a delayed frame buffer (360), a motion estimator (370), a map coder (380), and a multiplexer (390). With these modules, the encoder (300) performs live or off-line compression of a series of frames. The encoder (300) multiplexes the output of the various modules to produce a bitstream of compressed output (395) in system memory, a file in storage, one or more streams over a network, or another location. The input and output formats of the encoder (300) vary by implementation. For additional detail about particular modules of the encoder (300) in certain implementations, see the applications referenced in the Related Application Data section.

The encoder (300) compresses the first frame of the series as an I Frame (302) (alternatively called a key frame, intra frame, or intra-coded frame), using only information within the I Frame (302) to compress the I Frame (302). The encoder (300) compresses each of one or more subsequent frames of the series as a P Frame (304) (alternatively called a predicted frame, inter frame, or inter-coded frame). Each P Frame (304) may be compressed with reference to one or more other frames (for example, the previous frame). Also, the encoder (300) can compress a subsequent frame as an I Frame (304) periodically, as necessary (e.g., when the frame changes dramatically relative to the previous frame), or on some other basis.

For compression of an I Frame (302), the encoder (300) provides the I Frame (302) to the segmenter (310). The segmenter (310) partitions the I Frame (304) into continuous tone regions and palettized regions. The continuous tone regions are characterized by a large color space (e.g., 24 bits per pixel) and gradually varying color values from pixel to pixel. In a captured screen area, the continuous tone regions might include a background wallpaper photograph or an image in a web browser. On the other hand, the palettized regions are characterized by a smaller color space (e.g., 8 bits per pixel, often indices to a color palette), long runs of identical color values, and sharply contrasting changes in color value when changes occur. In a captured screen area, the palettized regions might include text on a solid background, icons, buttons, toolbars, menus, or other user interface features. The segmenter (310) may also segment graphical text from continuous tone regions, so that the text can be compressed losslessly, even if the encoder (310) introduces distortion in the continuous tone regions to reduce bitrate. Alternatively, the segmenter (310) uses other segmentation techniques and/or segments regions according to different or additional criteria.

The segmenter (310) transmits segmentation data (312) to the multiplexer (390) describing the segmented regions. The segmentation data (312) can be compressed in a lossy or lossless manner. The segmenter (310) also transmits pixel information for the regions of the I Frame (302) to the palettized region coder (320) and the continuous tone region coder (330).

The palettized region coder (320) compresses the palettized regions using techniques adapted to the characteristics of palettized screen content. Lossy compression techniques introduce distortion that can obliterate fine detail such as text and button graphics in palettized regions. Accordingly, the palettized region coder (320) uses lossless compression such as run length/Huffman encoding or arithmetic coding, as described in detail below.

The palettized region coder (320) transmits data such as the pixel information and side information for the palettized regions to the multiplexer (390). For example, the side information is information specifying a code book used by the coder (320).

The continuous tone region coder (330) compresses the continuous tone regions using techniques adapted to the characteristics of continuous tone screen content. The continuous tone region coder (330) uses a combination of lossy and lossless compression techniques. Ideally, the continuous tone region coder (330) uses lossless compression or introduces imperceptible distortion, but the bitrate for such compressed output is often too high. In many scenarios, output must be compressed to a lower bitrate, or available bits are better spent on higher frame rate to smooth changes in palettized regions from frame to frame. To reduce bitrate for the continuous tone regions at some cost to quality, the continuous tone region coder (330) uses some form of quantization (e.g., scalar or vector, uniform or non-uniform, and static or adaptive). Quantization introduces irreversible loss of information, but can also allow the encoder (300) to regulate quality and bitrate. The quantization potentially follows a frequency transformation or decomposition (e.g., DCT, FFT, MLT, wavelets, subband coding) of the pixel information for the continuous tone regions, and can incorporate perceptual modeling. After the quantization, the continuous tone region coder (330) uses some form of lossless compression such as run length coding, arithmetic coding, dictionary coding, variable-to-variable length coding, Huffman coding, LZ coding, a combination of the above, or some other entropy coding technique. Alternatively, the continuous tone region coder (330) uses compression techniques different than or in addition to the foregoing techniques to compress the continuous tone regions.

The continuous tone region coder (330) transmits data such as pixel information and side information for the continuous tone regions to the multiplexer (390).

The rate controller (340) regulates the overall bitrate of the compressed output (395) by controlling the quantization of the continuous tone regions in the continuous tone region coder (330). The rate controller (340) receives information from other modules of the encoder (300), including the bitrate of the palettized regions for the frame and the current fullness of a virtual buffer in the multiplexer (390). Using this information and other information for the encoding session (e.g., average bits per pixel for I Frame or P Frame, quality criteria), the rate controller (340) budgets bits for the continuous tone regions and transmits the bit budget to the continuous tone region coder (330). The rate controller (340) seeks to satisfy numerous bitrate and quality constraints, both instantaneous and long term. For example, the rate controller (340) seeks to avoid virtual buffer underflow and overflow, maintain relatively constant bitrate over time, allocate bits for continuous tone regions fairly from frame to frame, and maintain at least a minimum quality for continuous tone regions. The continuous tone region coder (330) tests one or more quantization levels, and the results are evaluated in terms of bitrate and quality. When the quality of the continuous tone regions falls below a certain point, the encoder (300) may drop a frame or the continuous tone regions rather than send poor quality information. Alternatively, the rate controller (340) uses techniques different than or in addition to the foregoing techniques to control the rate and/or quality of some or all types of pixel information.

The multiplexer (390) multiplexes the information received from the various modules of the encoder (300), producing output (395) in a format that the decoder (400) recognizes. The multiplexer (390) may also receive other information not shown in FIG. 3, such as frame header information, from the various modules of the encoder (300) or elsewhere. The multiplexer (390) includes a virtual buffer, which stores a pre-determined duration of compressed information (e.g., 5 seconds) in order to smooth over short-term fluctuations in bitrate due to complexity changes or other characteristics of the content or encoder (300). The virtual buffer outputs data at a constant or relatively constant bitrate (e.g., to a file or stream). The current fullness of the virtual buffer, the rate of change of fullness of the buffer, and other characteristics of the buffer can be used by the rate controller (340).

For compression of a P Frame (304), the encoder (300) provides the P Frame (304) to the motion estimator (370). The motion estimator (370) compares the P Frame (304) to the previous frame (362) buffered in the delayed frame buffer (360), which can be an I Frame or P Frame. In a pixel-by-pixel map for the P Frame (304), the motion estimator (370) indicates which of the pixels of the P Frame (304) are identical in value to the pixels at the same locations in the previous frame (362). For regions of non-identical pixels in the P Frame (304), the motion estimator (370) computes motion data (372) (e.g., motion vector(s)) describing motion relative to the previous frame (362). To compute the motion data (372) the motion estimator searches in the previous frame (362) for regions that match the regions of non-identical pixels in the P frame (304). One match criterion is the number of exactly matching pixels. In the map for the P Frame (304), the motion estimator (370) indicates which of the pixels of the P Frame (304) should be reconstructed by motion compensation using the motion data (372). If the motion data includes multiple motion vectors, the map indicates which pixels should be reconstructed using which motion vector. The remaining pixels of the P Frame (304) are intra pixels—neither identical in value to pixels at the same locations in the previous frame (362) nor predicted by the motion estimation. Alternatively, the motion estimator (370) uses techniques different than or in addition to the foregoing techniques to predict values for P Frames from reference frames and indicate the results.

The motion estimator (370) transmits the pixel-by-pixel map to the map coder (380). The motion estimator (370) also transmits pixel information for the intra pixels (374) of the P Frame (304) to the segmenter (310).

The map coder (380) compresses the pixel-by-pixel map for the P Frame (304) using a lossless compression technique such as run length coding, arithmetic coding, dictionary coding, variable-to-variable length coding, Huffman coding, LZ coding, a combination of the above, or some other entropy coding technique. Alternatively, the map coder (380) uses compression techniques different than or in addition to the foregoing techniques to compress the pixel-by-pixel map. For example, in one alternative embodiment, the map coder compresses the map using lossy compression as well as lossless compression. The map coder (380) transmits data such as the compressed map to the multiplexer (390). In one implementation, the encoder (300) uses the same module for the palettized region coder (320) and the map coder (380).

The segmenter (310), the palettized region coder (320), the continuous tone region coder (330), and the rate controller (340) perform the operations described above to compress the intra pixels (374) of the P Frame (304).

In alternative embodiments, an encoder with different modules and/or other configurations of modules performs the described adaptive entropy encoding techniques. For example, although the exemplary encoder (300) includes the segmenter (310), continuous tone region coder (330), rate controller (340), motion estimator (370), and map coder (380), in alternative embodiments, an encoder performs one of the described adaptive entropy encoding techniques without segmentation, separate continuous tone content coding, rate allocation, motion estimation, and/or map coding.

B. Exemplary Screen Capture Decoder

The exemplary screen capture decoder (400) includes a demultiplexer (410), a palettized region decoder (420), a continuous tone region decoder (430), a frame assembler (440), a delayed frame buffer (460), a motion compensator (470), and a map decoder (480). With these modules, the decoder decompresses a series of frames for playback. For additional detail about particular modules of the decoder (400) in certain implementations, see the applications referenced in the Related Application Data section.

The demultiplexer (410) demultiplexes the compressed input (405), producing outputs for the various modules of the decoder (400). In addition to the outputs shown, the demultiplexer (410) may produce other outputs, such as frame header information for the frame assembler (490).

For decompression of an I Frame, the palettized region decoder (420) decompresses the palettized regions of the frame, for example, reversing the compression performed in the palettized region coder (320). The palettized region decoder (420) transmits the decompressed information for the palettized regions to the frame assembler (490).

The continuous tone region decoder (430) decompresses the continuous tone regions of the frame, producing reconstructed versions. For example, the continuous tone region decoder (430) reverses lossless compression performed in the continuous tone region coder (330) and then reverses any quantization and frequency transform/decomposition operations performed in the continuous tone region coder (330), typically performing the inverse of the operation. The continuous tone region decoder (420) transmits the decompressed information for the continuous tone regions to the frame assembler (490).

The frame assembler (490) receives the segmentation data (412) from the demultiplexer (410) as well as the decompressed information from the palettized region decoder (420) and the continuous tone region decoder (430). Using this information, the frame assembler (490) constructs the I Frame. For example, the frame assembler (490) uses the segmentation data (412) to determine where to place the decompressed pixel information for the palettized regions and continuous tone regions in the I Frame. The frame assembler (490) then outputs a frame (495) for playback. The delayed frame buffer (460) can store the output frame (495) for use as a reference frame for the following frame.

For decompression of a P Frame, the map decoder (480) decompresses the map data (416), for example, reversing the compression performed in the map coder (380). The map decoder (480) transmits data such as the decompressed map to the motion compensator (470). In one implementation, the decoder (400) uses the same module for the palettized region decoder (420) and the map decoder (480).

The motion compensator (470) receives the motion data (414) from the demultiplexer (410) as well as the decompressed map from the map decoder (480). Using the decompressed map and the previous frame (462), the motion compensator (470) constructs the regions of pixels of the P Frame that are identical in value to the pixels at the same locations in the previous frame (462). Using the decompressed map, the motion data (414), and the previous frame (462), the motion compensator (470) constructs the motion-compensated regions of pixels of the P Frame. Alternatively, the motion compensator (470) uses techniques different than or in addition to the foregoing techniques to compensate for prediction in the encoder. The motion compensator (470) transmits the constructed regions of the P Frame to the frame assembler (490).

The palettized region decoder (420) and continuous tone region decoder (430) decompress pixel information for the intra pixels of the P Frame, using the techniques described above.

The frame assembler (490) receives the decompressed pixel information for the intra pixels, the segmentation data (412) from the demultiplexer (410), and the constructed regions from the motion compensator (470). Using this information, the frame assembler (490) constructs the P Frame. For example, the frame assembler (490) uses the segmentation data (412) to determine how to place the decompressed pixel information for the palettized regions and continuous tone regions of the intra pixels of the P Frame around the constructed regions from the motion compensator (470). The frame assembler (490) then outputs a frame (495) for playback, which can be stored in the delayed frame buffer (460) for use as a reference frame.

In alternative embodiments, a decoder includes different modules and/or other configurations of modules. For example, although the exemplary decoder (400) includes the map decoder (480), motion compensator (470), continuous tone region decoder (430), and frame assembler (490), in alternative embodiments, a decoder performs one of the described adaptive entropy decoding techniques without separate continuous tone content decoding, motion compensation, map decoding, and/or frame assembly as described above.

III. Mode Switching for Palettized Screen Capture Content

Under normal operating conditions, a screen capture encoder emphasizes bitrate reduction when compressing palettized screen capture content. Under certain conditions, however, the encoder requires encoding speed at the expense of bitrate reduction. To accomplish this, or to change for other reasons, the encoder switches between different entropy encoding modes for palettized screen capture content. On the decoding side, a decoder switches between entropy decoding modes when decompressing the palettized screen capture content.

A. Entropy Encoding Mode Switching

Figure 5:
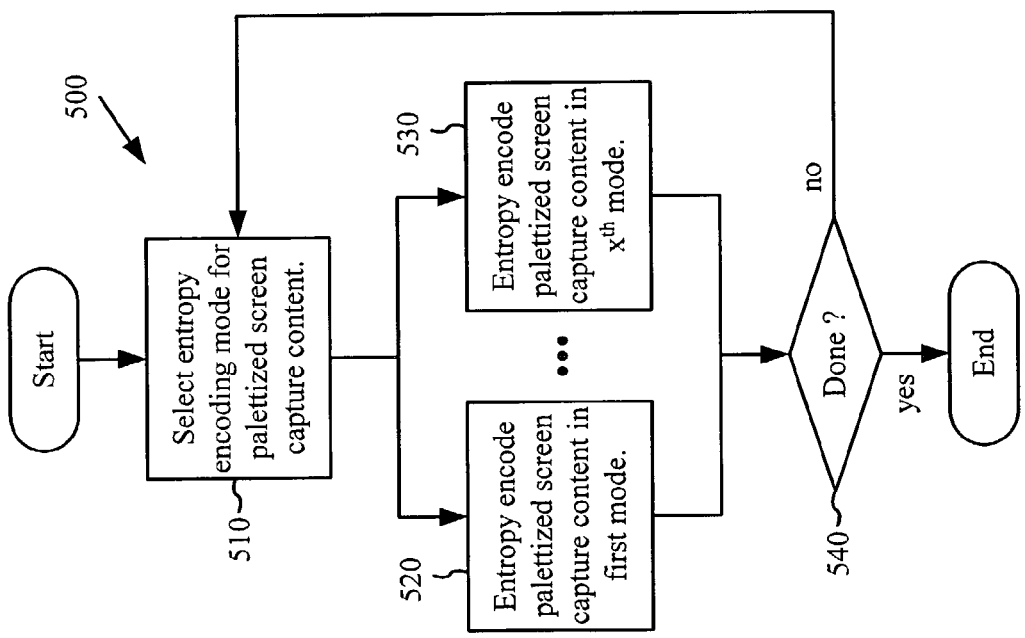
FIGS. 5 and 6 are flowcharts illustrating techniques for switching between entropy encoding modes when compressing palettized screen capture content.
Figure 6:
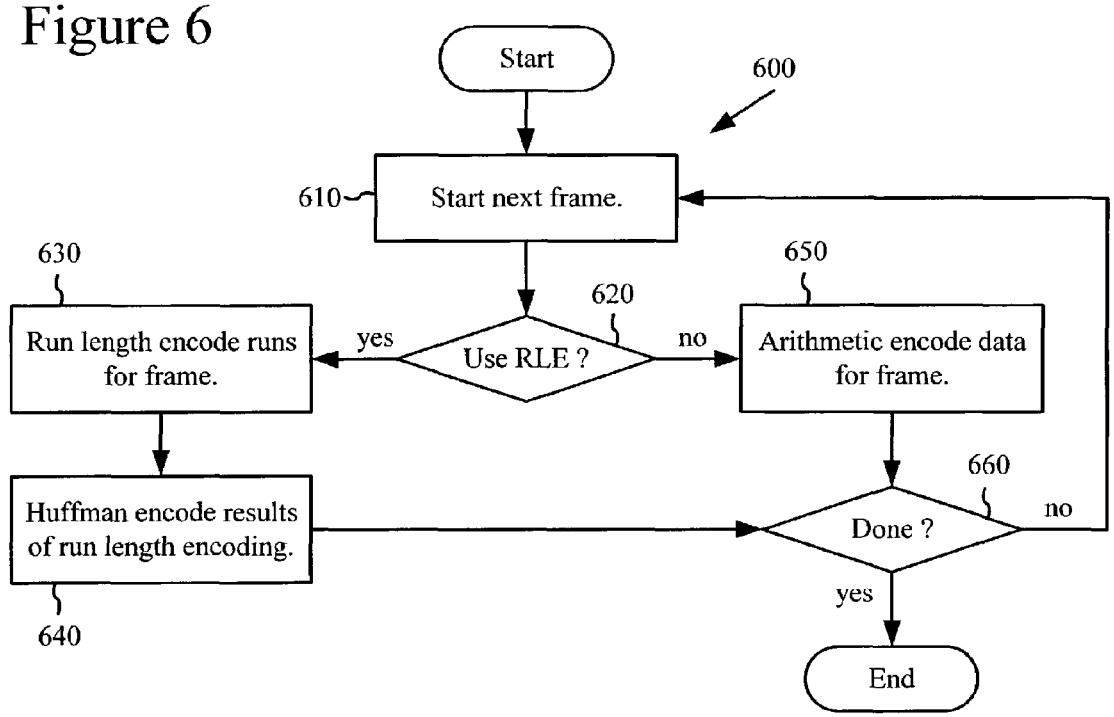

FIGS. 5 and 6 show techniques (500, 600) for switching between entropy encoding modes when compressing palettized screen capture content. An encoder such as the screen capture encoder (more precisely, the palettized region coder (320) or module therein) described with reference to FIG. 3 performs the mode switching. Alternatively, another encoder performs the mode switching.

For the sake of simplicity, FIGS. 5 and 6 (and later flowcharts in FIGS. 7–10 and 12–14) do not show how techniques relate to the rest of the encoding/decoding process. Moreover, depending on implementation, the timing and order of operations in the techniques can vary. For example, in some implementations, the placement of conditional logic is rearranged or the ordering of various operations is switched.

In the generalized technique (500) of FIG. 5, the encoder switches between any of x different encoding modes according to selection criteria. The encoder selects (510) an entropy encoding mode for the palettized screen capture content. The encoder performs the selection on a frame-by-frame basis, a sequence-by-sequence basis, or on some other basis. Or, the encoder performs the selection as needed according to some overall or current constraint relating to bitrate, processor capacity, encoding time, or another factor.

The encoder then entropy encodes (520, 530) the palettized screen capture content in the selected mode. In general, the encoder selects between some arbitrary number×different encoding modes. The encoder then determines (540) whether to continue or end.

FIG. 6 shows a more detailed technique (600) for switching between entropy encoding modes on a frame-by-frame basis when compressing palettized screen capture content. In the technique (600), the encoder selects between an arithmetic encoding mode and a combined run length/Huffman encoding mode according to processor utilization criteria.

The encoder starts (610) with the next frame of screen capture video and determines (620) whether to use the run length/Huffman encoding or the arithmetic encoding. For example, the encoder receives real time processor utilization feedback and makes the switching decision based upon current processor usage. When processor utilization is below some threshold amount, the encoder selects the arithmetic encoding mode. Otherwise, the encoder selects the run length/Huffman encoding mode. This allows the encoder to use the run length/Huffman encoding mode for time-critical compression, but use the arithmetic encoding mode in other situations. Alternatively, the encoder makes the selection decision at some other interval. For example, the encoder encodes an entire sequence using the run length/Huffman encoding mode for live capture and streaming, and then transcodes the content offline to a lower bitrate form using the arithmetic encoding mode.

If the encoder selects the run length/Huffman encoding mode, the encoder run length encodes (630) runs for the palettized screen capture content of the frame. The encoder then Huffman encodes (640) the results of the run length encoding. For example, the encoder uses the run length encoding and Huffman encoding described in the following sections. Alternatively, the encoder uses other forms of run length encoding and/or Huffman encoding.

Otherwise, the encoder performs (650) arithmetic encoding on the palettized screen capture content of the frame. For example, the encoder uses the arithmetic encoding with context color coding as described in the Background of the application. Alternatively, the encoder uses another form of arithmetic encoding.

The encoder then determines (640) whether to continue with the next frame or end.

The bitrate of the palettized screen capture content is typically lower with the arithmetic encoding that with the run length/Huffman encoding. On the other hand, encoding time and processor utilization are typically much higher. Moreover, with the arithmetic coding, encoding time and processor utilization can fluctuate widely depending on the complexity of the palettized content. In contrast, performance with the run length/Huffman encoding is relatively uniform for different types and complexities of palettized content. Thus, by switching between the arithmetic coding and the run length/Huffman encoding, the encoder can emphasize bitrate reduction at some times, while emphasizing encoding speed at other times.

B. Entropy Decoding Mode Switching

Figure 7:
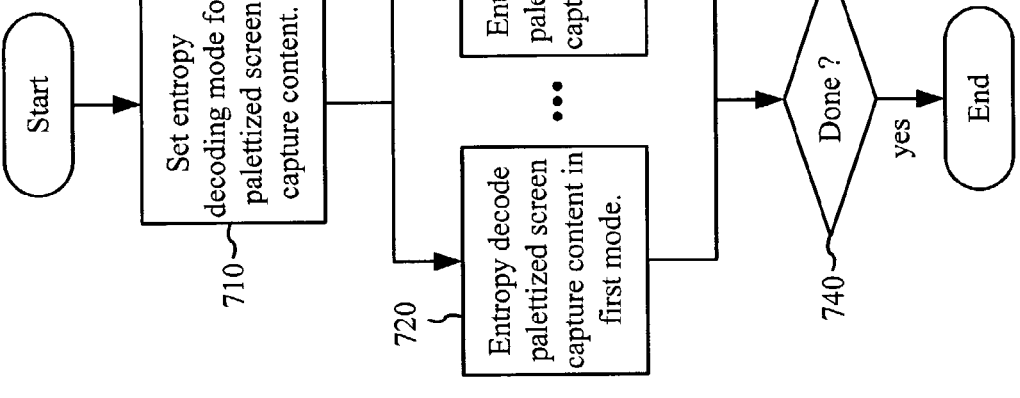
FIGS. 7 and 8 are flowcharts illustrating techniques for switching between entropy decoding modes when decompressing palettized screen capture content.

FIG. 7 shows a generalized technique (700) for switching between entropy decoding modes when decompressing palettized screen capture content. A decoder such as the screen capture decoder (more precisely, the palettized region decoder (420) or module therein) described with reference to FIG. 4 performs the mode switching. Alternatively, another decoder performs the mode switching. In the technique (700), the decoder switches between any of x different decoding modes in reaction to switching criteria.

The decoder sets (710) an entropy decoding mode for the palettized screen capture content. For example, the decoder receives a flag (e.g., placed in a bitstream by the encoder) and sets the decoding mode to the mode indicated by the flag. Alternatively, the decoder sets the decoding mode based upon other information from the encoder or based upon context information available to the encoder and decoder. The decoder sets the decoding mode on a frame-by-frame basis, a sequence-by-sequence basis, only when instructed, or on some other basis.

The decoder then entropy decodes (720, 730) the palettized screen capture content in the selected mode. In general, the decoder selects between some arbitrary number×different decoding modes. The decoder then determines (740) whether to continue or end.

Figure 8:
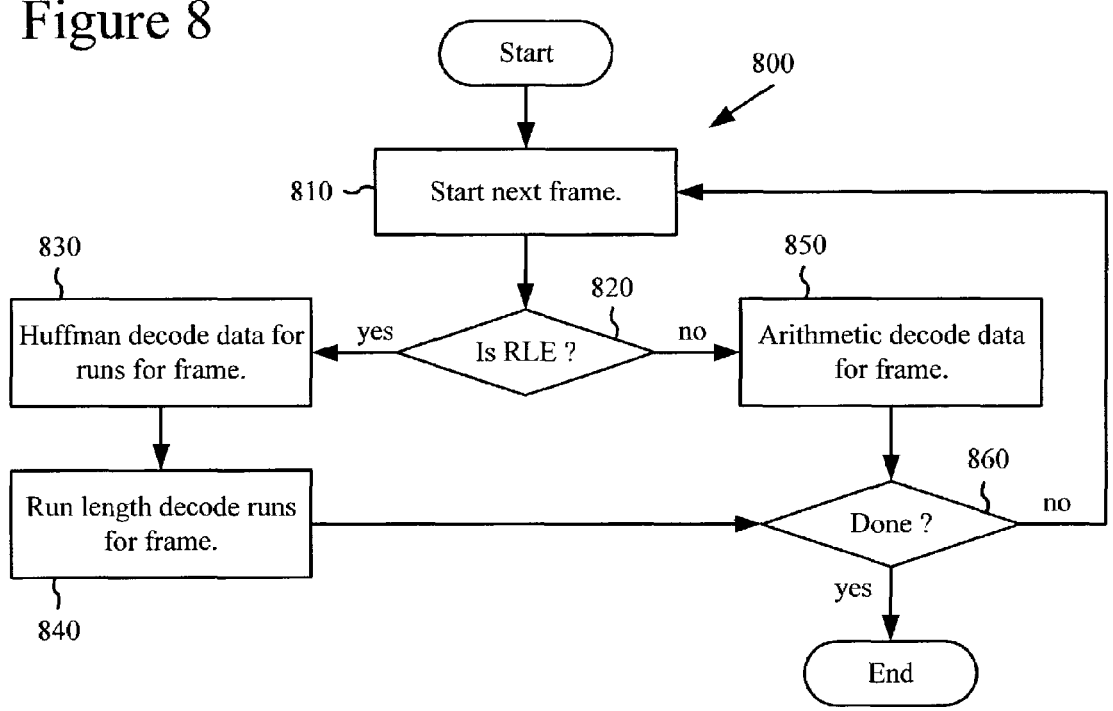

FIG. 8 shows a more detailed technique (800) for switching between entropy decoding modes on a frame-by-frame basis when decompressing palettized screen capture content. In the technique (800), the decoder selects between an arithmetic decoding mode and a combined run length/Huffman decoding mode according to flags in the frame headers for frames.

The decoder starts (810) with the next frame of screen capture video. Based upon the value of a flag in the frame header for the frame, the decoder determines (820) whether to use run length/Huffman decoding or arithmetic decoding. Alternatively, the decoder sets the decoding mode at some other interval and/or based upon other information.

If run length/Huffman decoding is the decoding mode, the decoder Huffman decodes (830) the Huffman encoded data for the runs for the palettized screen capture content of the frame. The decoder then run length decodes (840) the runs for the palettized screen capture content of the frame. For example, the decoder uses the Huffman decoding and run length decoding described in the following sections. Alternatively, the decoder uses other forms of Huffman decoding and/or run length decoding.

Otherwise, the decoder performs (850) arithmetic decoding on the palettized screen capture content of the frame. For example, the decoder reverses the arithmetic encoding with context color coding described in the Background of the application. Alternatively, the decoder uses another form of arithmetic decoding.

The decoder then determines (840) whether to continue with the next frame or end.

IV. Run Length Encoding/Decoding for Palettized Screen Capture Content

Under certain conditions, the screen capture encoder uses a variation of run length encoding that is adapted to the characteristics of palettized screen capture content. Compared to other forms of entropy encoding (e.g., arithmetic coding), the screen capture run length encoding is relatively simple, consistent, and fast. Compared to other variations of run length encoding, the screen capture run length encoding achieves better compression for screen capture content, but still retains the predictable and fast performance that characterizes run length encoding.

A. Adaptations for Palettized Screen Capture Content

In several respects, the run length encoding is adapted to the characteristics of palettized screen capture content in order to reduce bitrate for the palettized screen capture content.

First, palettized screen capture content typically exhibits redundancy between successive rows. Often, only a few pixels (if any) are different between a row and the row above/below it. Accordingly, the encoder uses a previous row (or "above") symbol that indicates the color value (e.g., the index to a color palette, or the color component value(s) in some color space) of a given pixel is identical to the color value of the corresponding pixel in the previous row (i.e., the pixel above the given pixel). During decoding, the color value of the corresponding pixel in the previous row is used for the color value of the given pixel.

Second, palettized screen capture content typically exhibits redundancy between successive frames. Accordingly, the encoder uses a previous frame symbol that indicates the color value of a given pixel is identical to the color value of the corresponding pixel in the previous frame (i.e., the pixel at the same coordinates in the previous frame). During decoding, the color value of the corresponding pixel in the previous frame is used for the color value of the given pixel. In implementations that already use some form of interframe coding (e.g., with differencing between frames and a pixel-by-pixel map, as described above), the previous frame symbol may not be necessary or efficient to use.

The encoder run length encodes and Huffman encodes the above symbols and previous frame symbols as part of the same alphabet used to represent regular color values. Table 1 shows the symbol alphabet in one implementation.

TABLE 1

Symbol Alphabet

| Symbol | Meaning |
|---|---|
| value_$x_0$ | Run value for the color value $x_0$ for a current pixel or run of pixels. |
| . . . | . . . |
| value_$x_{j-1}$ | Run value for the color value $x_{j-1}$ for a current pixel or run of pixels. |
| value_above | Run value indicating the color value for a pixel above a current pixel. For a run, the color values for the pixels above the pixels in the run. |
| value_PF | Run value indicating the color value for a pixel at the same location in the previous frame. For a run, the color values for the pixels at the same locations in the previous frame. |
| repeat_0 | Run length with interpretation described below. |
| . . . | . . . |
| repeat_k-1 | Run length with interpretation described below. |
| repeat_esc | Run length escape code for lengths not represented with other run length symbols. |

As for run values, in addition to the above and previous frame symbols, the symbol alphabet includes symbols for j different color values. For example, each of the j different color values is an index to a color palette. In one implementation, j=256 for a palette with 256 colors. Alternatively, each of the j different color values is a color value in some other format. The symbol alphabet can be populated with different or additional run value symbols, or use another convention for run values.

Since above symbols are subject to run length encoding like regular color value symbols, it is possible to have a run of above symbols, meaning that a row of pixels is identical to the row above it for the duration of the run. Similarly, it is possible to have a run of previous frame symbols.

As for run lengths, the symbol alphabet includes k different run length symbols (from 0 to k-1) as well as a run length escape code symbol. Depending on the convention adopted for representing run lengths, the run length symbols can have different meanings and syntax. Numerous conventions for representing run lengths exist. For example, different conventions incorporate different integer representations such as direct representation, Elias gamma or delta codes, Golomb and Rice codes, or a hybrid thereof.

In one simple convention, for the k different run length symbols, the symbol repeat_y (where y is an integer between 0 and k-1) means repeat a particular value for y times (alternatively, y+1 times). This can be inefficient when the run length symbols are relatively evenly distributed between a large number of possible lengths. The run length escape code is followed by an integer or other combination of values indicating how many times to repeat a particular value.

According to another convention, for the k different run length symbols, the symbol repeat_y (where y is an integer between 0 and k-1) means repeat a particular value for z times, where z is derived from the symbol repeat_y and the y bits following the symbol repeat_y. The interpretation of run length symbols can be the same for regular runs, above symbol runs, and previous frame symbol runs, or the interpretation can be different. For example, Table 2 shows usage of run length symbols according to this convention, where the run length symbols are interpreted the same for different run types. (In the final representation, Huffman codes may replace the run length and run value symbols, which Table 2 does not show.)

TABLE 2

Representation of Run Lengths According to One Convention

| Run | Represented As |
|---|---|
| single pixel with color value 0 | value_$x_0$ |
| horizontal run of 2 identical pixels with color value 0 | value_$x_0$ repeat_0 |
| horizontal run of 3 identical pixels with color value 0 | value_$x_0$ repeat_1 0 |
| horizontal run of 4 identical pixels with color value 0 | value_$x_0$ repeat_1 1 |
| horizontal run of 5 identical pixels with color value 0 | value_$x_0$ repeat_2 00 |
| horizontal run of 6 identical pixels with color value 0 | value_$x_0$ repeat_2 01 |
| horizontal run of 7 identical pixels with color value 0 | value_$x_0$ repeat_2 10 |
| horizontal run of 8 identical pixels with color value 0 | value_$x_0$ repeat_2 11 |
| horizontal run of 9 identical pixels with color value 0 | value_$x_0$ repeat_3 000 |
| . . . | . . . |
| horizontal run of 1425 identical pixels with color value 0, where k is 10 | value_$x_0$ repeat_esc 0000 10110010001 |
| . . . | . . . |
| single reference to symbol above | value_above |
| 2 consecutive references to symbol above | value_above repeat_0 |
| 3 consecutive references to symbol above | value_above repeat_1 0 |
| 4 consecutive references to symbol above | value_above repeat_1 1 |
| 5 consecutive references to symbol above | value_above repeat_2 00 |
| 6 consecutive references to symbol above | value_above repeat_2 01 |
| 7 consecutive references to symbol above | value_above repeat_2 10 |
| 8 consecutive references to symbol above | value_above repeat_2 11 |
| . . . | . . . |

With this convention, runs of 2 to $2^k$ identical pixels are represented with the symbols repeat_0 to repeat_k-1 followed by the indicated number of bits. For longer runs, the run length escape code is used, followed by an integer of pre-determined length s (e.g., 4 bits), and then k+s+1 bits indicating the length. For example, if k=10, the longest run that can be represented without the escape code is 1024 pixels (with the sequence repeat_9 111111111). So, the run length 1425 for a run is represented by repeat_esc followed by 0000 for s=0 and the 10+0+1 bits 10110010001. (In a slight further optimization, the encoder first subtracts $2^k$ from the run length and might use fewer bits, since any of the first $2^k$ lengths is encoded without the escape code.)

Alternatively, the symbol alphabet is populated with different or additional run length symbols, or uses some other convention for representing run lengths.

B. Run Length Encoding With Selection Between Alternative Runs

In many cases, a particular series of pixels belongs to a previous row run as well as a regular run (a series of pixels with identical color values). Or, the particular series of pixels belongs to a previous frame run as well as a regular run. In a few cases, a series of pixels belongs to a regular run, a previous row run, and a previous frame run. These are specific examples of a more general phenomenon—alternative runs of different run values for a particular series of pixels. In terms of bitrate reduction, the most efficient choice of alternative runs depends on the series of pixels and context. To address cases of alternative runs, the encoder dynamically decides during encoding which of the alternative runs to use.

Figure 9:
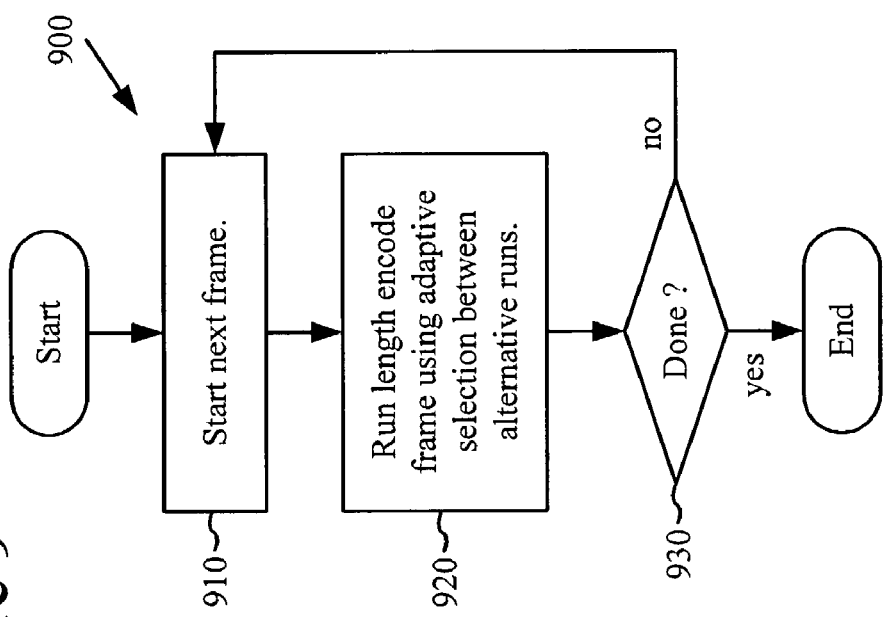
FIGS. 9 and 10 are flowcharts illustrating techniques for run length encoding using adaptive selection between alternative runs.
Figure 10:
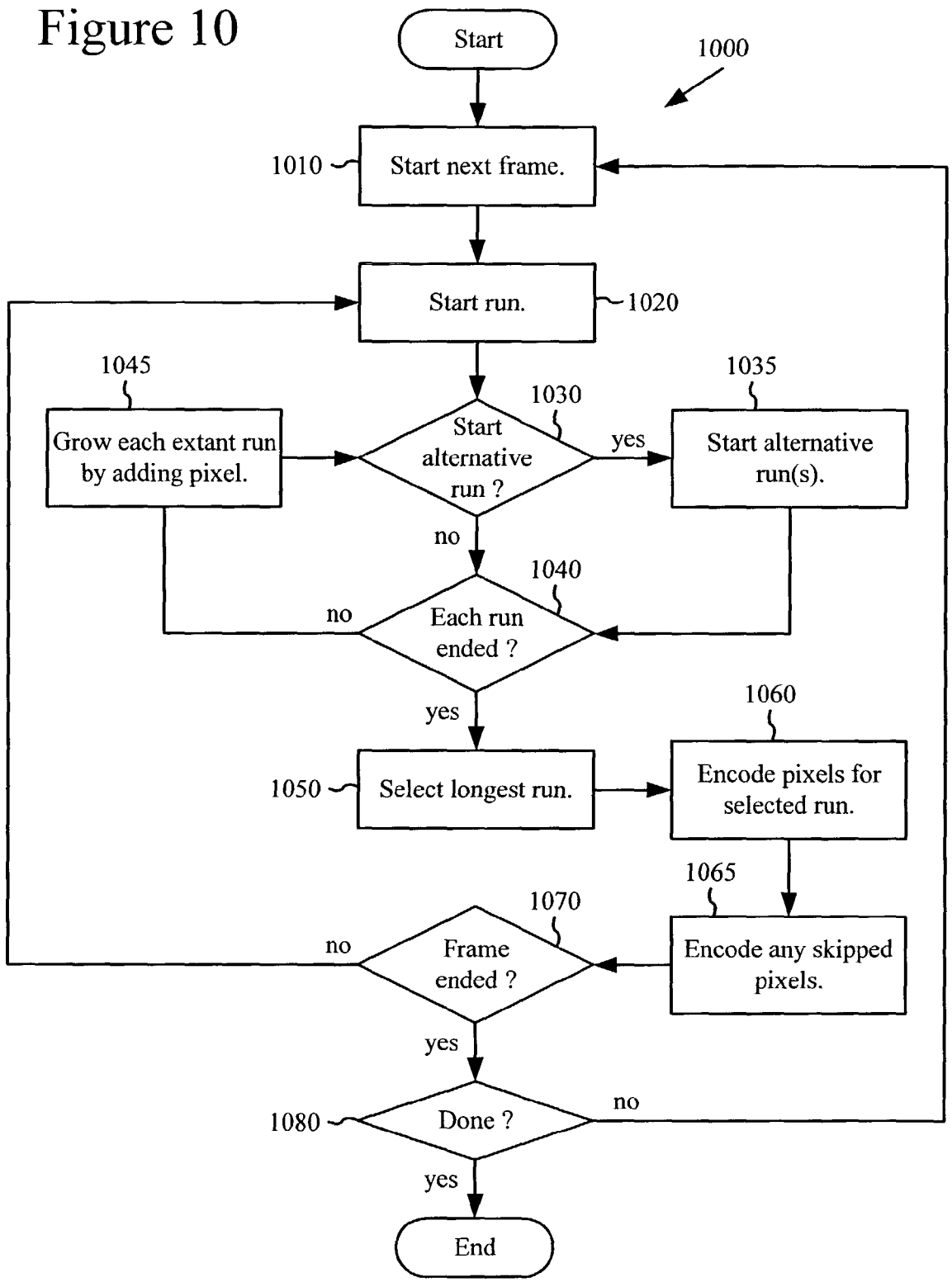
Figure 11A:
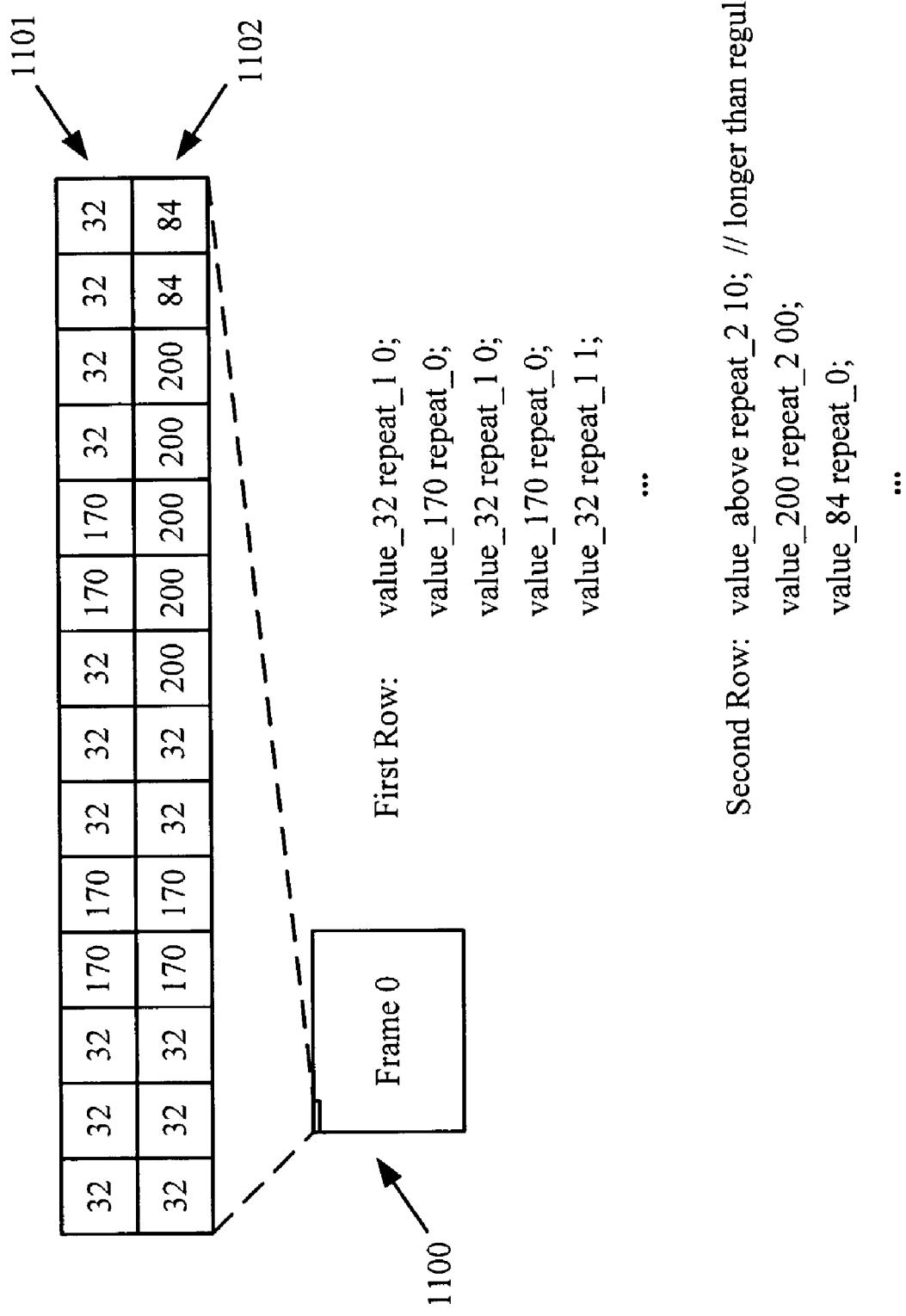
FIGS. 11a and 11b are diagrams of an example of run length encoding using adaptive selection between alternative runs.
Figure 11B:
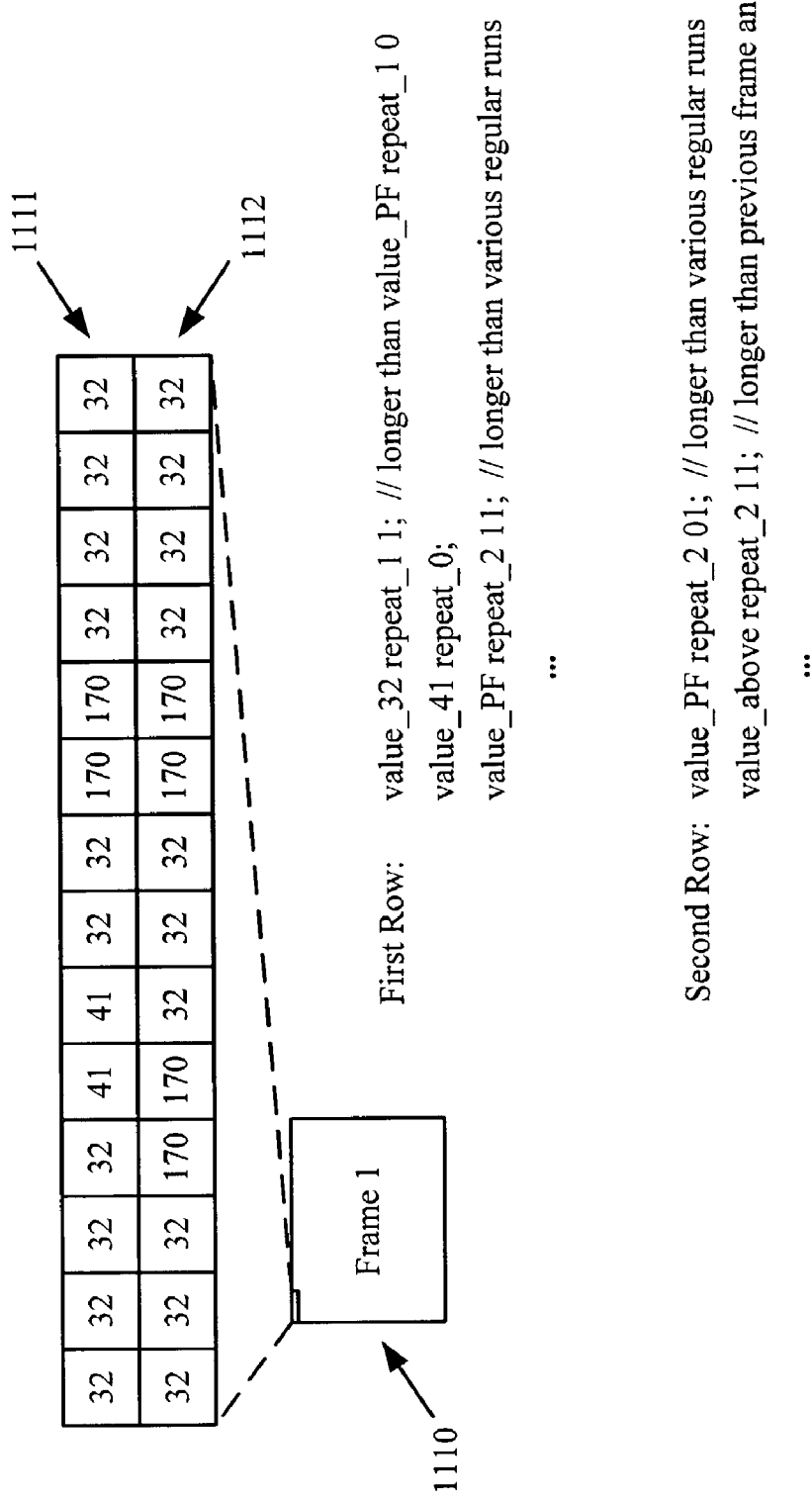

FIGS. 9 and 10 show techniques (900, 1000) for run length encoding using adaptive selection between alternative runs, and FIGS. 11a and 11b show an example of run length encoding using adaptive selection between alternative runs. An encoder such as the screen capture encoder (more precisely, the palettized region coder (320) or module therein) described with reference to FIG. 3 performs the run length encoding. Alternatively, another encoder performs the run length encoding on palettized screen capture content or another kind of content.

FIG. 9 shows a generalized technique (900) for run length encoding using adaptive selection between alternative runs. Starting (910) with the next frame in a series of frames, the encoder run length encodes (920) the palettized screen capture content in the frame using adaptive selection between alternative runs. At times during the run length encoding, the encoder detects pixel series that could be encoded with alternative runs. For example, the encoder detects an instance of a pixel series that could be encoded as previous row run and/or previous frame run as well as a regular run. The encoder maintains the states of the alternative runs and delays the decision of which run type should be used until all of the alternative runs have completed. For example, the encoder evaluates the lengths of the runs for the different run values, then selects the run value that yields the longest run. The encoder then continues with the next pixel or series of pixels (or potentially with remaining pixels around the selected run, which have already been scanned). The encoder then determines (930) whether to continue with the next frame in the series or end.

Instead of or in addition to the regular, above, and previous frame run values described above, the encoder can evaluate runs using other run values for the pixel series. For example, the other run values reference pixels in other rows, columns, or frames in the series. Or, the encoder encodes runs for color values that are within some threshold of each other or the color value for the run, not just identical color values.

The length of the runs for the different run values is a reasonable accurate predictor of efficiency for the different run types. In particular, it works well if entropy coding for the different run values and run lengths is adaptive to content to be encoded. Alternatively, the encoder uses some other test to evaluate the efficiency of using different run values for a pixel series. For example, the encoder evaluates the expected bitrate for the different run types using known variable length codes for the run values and run lengths (i.e., the variable length codes do not adapt to the content to be encoded). Or, the encoder uses some other mechanism to measure or predict bitrate for the different run types.

If the encoder does not allow alternative runs to start after the initial position of a series, the encoder may miss a more efficient overall selection of runs. Consider the current sequence 200 200 84 84, for example, with the preceding row 170 200 84 84. If the encoder progresses from left to right and only starts alternative runs at the beginning of series, the current sequence becomes value_200 repeat_0 value_84 repeat_0, using the run length symbols as shown in Tables 1 and 2. This is one more symbol than value_200 value_above repeat_1 0, which also parameterizes the current sequence. Accordingly, in some implementations, the encoder allows starting alternative runs in the middle of series and continues growing alternative runs until a point at which all runs have ended. For example, the encoder grows the regular run for value_200 and when that run ends, continues to grow the previous row run that starts at the second position. When the previous row run ends, the regular run of value_84 also ends, and the encoder selects the previous row run as the longest run. The encoder also encodes any skipped pixels (e.g., the first pixel 200) at that time.

Or, the encoder looks further ahead to the end of a row or other location in the series to assess how different choices of alternative runs affect the efficiency of later run length encoding. For example, the encoder encodes the entire look ahead portion with both regular and previous row runs, then selects runs, starting with the longest and continuing until all pixels are encoded. Or, the encoder isolates and encodes the longest run of any type in the look ahead portion, then starts over and isolates the longest run of any type in the remaining pixels of the look ahead portion, etc.

In one implementation, following a standard raster scan pattern, series of pixels are run length encoded in a left to right, top row to bottom row pattern in a frame. A run automatically terminates when it reaches the end of a row in the frame. Alternatively, runs are encoded in some other scan pattern, runs can continue from the end of one row to the beginning of the next row, or runs can continue from frame to frame.

FIG. 10 shows a more detailed technique (1000) for run length encoding using adaptive selection between alternative runs. In the technique (1000), the encoder evaluates runs for a series of pixels according to length criteria and allows alternative runs to start in middle of evaluating other runs.

Starting (1010) with the next frame in a series of frames, the encoder starts (1020) a run for pixels in the frame. For example, the encoder starts a regular run for the pixels using a color value.

The encoder then determines (1030) whether to start an alternative run. For example, for the pixel at the end of a current regular run, the encoder determines whether runs can be started using an above value and/or a previous frame value. If so, the encoder starts (1035) the alternative run(s). In one implementation, to simplify processing, the encoder only evaluates either a previous row run or a previous frame run at any given time (in addition to regular runs)—if a previous row run has started, the encoder will not start a previous frame run, and vice versa.

The encoder determines (1040) whether each of the extant runs has ended. If not, the encoder grows (1050) each extant run by adding the next pixel to the run. The encoder then determines (1030) whether any additional alternative runs can be started at the new position. Thus, the encoder gradually increases the lengths of the alternative runs until a point at which all of the alternative runs have terminated.

If each of the extant runs has ended, the encoder selects (1050) the longest run and encodes (1060) the pixels for the selected run. In some cases, the selected run does not include all pixels that have been scanned by the encoder from the previous termination point up to the latest termination point 1040. So, the encoder run length encodes (1065) pixels that were skipped. For example, for the remaining pixels (the ones not in the selected run) since the last termination point, the encoder selects the longest possible run and encodes the pixels for that run, etc. until all pixels since the last termination point are encoded. (The actual bitstream of run length encoded data is organized by raster scan order for the runs, not the order in which runs are selected, to facilitate decoding in the raster scan order.) Alternatively, the encoder uses some other mechanism or timing to evaluate the different run types, or the encoder uses a criterion other than run length, as noted above.

After encoding (1060, 1065) the pixels since the last termination point, the encoder determines (1070) if the frame has ended. If not, the encoder starts (1020) a run for the remaining pixels in the frame. If the frame has ended, the encoder determines (1080) whether to continue with the next frame in the series or end.

In some cases, the encoder can automatically eliminate one or more of the run types for pixels. For example, for a first frame, previous frame runs are not possible, and for a top row, previous row runs are not possible. When a previous row run ends in the middle of the row, the next pixel will not be part of a previous row run. The same holds for a previous frame row.

FIGS. 11a and 11b show an example of run length encoding using adaptive selection between alternative runs. In the example, an encoder performs the technique (1000) of FIG. 10 on frames (1100, 1110) of palettized screen capture content using above and previous frame symbols as shown in Tables 1 and 2. For the sake of simplicity, FIGS. 11a and 11b show only the first segments of the first two rows of each frame.

For the first row segment (1101) of the first frame (1100), the encoder run length encodes multiple series of pixels as regular runs. At this point, the encoder does not use the above and previous frame symbols.

For the second row segment (1102) of the first frame (1100), the encoder detects alternative runs. The first pixels could be encoded as a seven pixel long previous row run or several shorter regular runs. When all the alternative rows have ended, the encoder selects the previous row run. The next seven pixels are not identical to the previous row, and the encoder encodes them as two regular runs.

For the first row segment (1111) of the second frame (1110), the encoder detects alternative runs. The first pixels could be encoded as a four pixel long regular run or a three pixel long previous frame run. The encoder selects the regular run. The next two values are encoded as a regular run. The next pixels could be encoded as an eight pixel long previous frame run or several regular runs, and the encoder selects the previous frame run after all the alternative runs have terminated.

For the second row segment (1112) of the second frame (1110), the encoder detects alternative runs. The pixels could be encoded as a seven pixel long previous frame run, several regular runs, or an eight pixel previous row run. After all runs have terminated (the end of the segment shown), the encoder selects the previous row run. The remaining (skipped) pixels could be encoded as a six pixel long previous frame run or several regular runs, and the encoder selects the previous frame run. As mentioned above, in one implementation, to simplify processing, the encoder evaluates either a previous row run or a previous frame run at any given time (in addition to regular runs). In that implementation, the encoder would not start the eight pixel previous row run concurrently with the seven pixel previous frame run (which starts earlier), but instead would select the seven pixel previous frame run and then a seven pixel previous row run.

C. Run Length Decoding of Selected Alternative Runs

Figure 12:
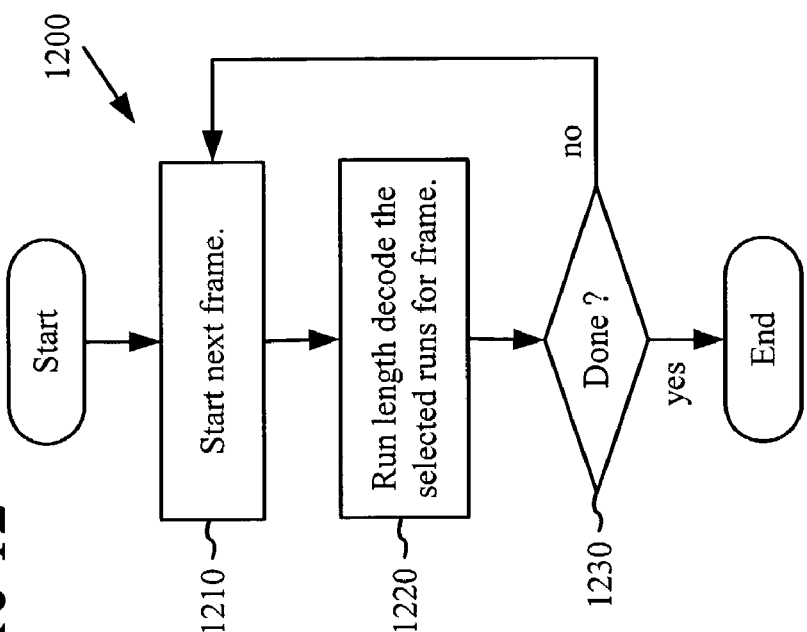
FIG. 12 is a flowchart illustrating a technique for run length decoding data including adaptively selected runs.

FIG. 12 show a generalized technique (1200) for run length decoding data including adaptively selected runs. A decoder such as the screen capture decoder (more precisely, the palettized region decoder (420) or module therein) described with reference to FIG. 4 performs the run length decoding. Alternatively, another decoder performs the run length decoding on palettized screen capture content or another kind of content.

Starting (1210) with the next frame in a series of frames, the decoder run length decodes (1220) data for the palettized screen capture content in the frame. The data includes adaptively selected runs of different types. The decoder run length decodes the run values for the different kinds of runs, repeating the particular run values by the number of times indicated by the particular run lengths (or, more efficiently, decoding directly to the appropriate color values using the color values of previously decoded pixels in the same row, previous row, or previous frame). For example, the decoder converts regular run values to color values for pixels, converts above symbols to color values for pixels based upon the color values of the corresponding pixels in the previous row, and converts previous frame symbols to color values for pixels based upon the color values of the corresponding pixels in the previous frame.

Instead of or in addition to the regular, above, and previous frame run values described above, the decoder can decode runs using other run values for the pixels. For example, the other run values reference pixels in other rows, columns, or frames in the series.

The decoder then determines (1230) whether to continue with the next frame in the series or end.

V. Adaptive Huffman Encoding/Decoding

Under certain conditions, a screen capture encoder uses a variation of adaptive Huffman encoding to compress the results of run length encoding of palettized screen capture content. Compared to other kinds of adaptive Huffman encoding, the variation decreases the number of bits required to specify a Huffman code table, while largely preserving the compression gains of the adaptive Huffman encoding.

A. Overall Flow in Screen Capture Encoder and Decoder

The screen capture encoder creates a Huffman code table for some set of run length encoded data. The encoder then Huffman encodes the set of data using the Huffman code table. To decode the data, a screen capture decoder receives the encoded data and information specifying the Huffman code table. The decoder reconstructs the Huffman code table and then Huffman decodes the encoded data.

In more detail, the encoder creates a Huffman code table for a batch of run length encoding symbols (e.g., run values and run lengths). The batch of symbols can be for a frame of palettized screen capture content, or for some other portion of screen capture video. In a first pass over the batch of symbols, the encoder collects probability statistics for the different unique symbol values in the batch of symbols. The encoder then assigns Huffman codes to the different unique symbol values, assigning shorter codes to the more probable symbol values, longer codes to the less probable symbol values, etc. Various techniques for assigning Huffman codes based upon probabilities are well known. One common structure for the Huffman code table is a binary tree in which different paths to leaf nodes indicate the Huffman codes, but other structures such as arrays can instead be used depending on implementation. At some point, the encoder provides information specifying the Huffman code table to the decoder, for example, the Huffman codes, probabilities for unique symbol values, or lengths for the Huffman codes.

In a second pass over the batch of symbols, the encoder encodes the batch of symbols, replacing symbol values with corresponding Huffman codes. Alternatively, the encoder uses some other mechanism or timing to collect probability statistics, create the Huffman code table, and encode data.

For the decoding to work, the encoder and decoder use the same set of Huffman codes for encoding and decoding data. The decoder receives information specifying the Huffman code table and reconstructs the Huffman code table from the information. The decoder then Huffman decodes the batch of symbols, replacing Huffman codes with corresponding symbol values.

Each Huffman code table can include Huffman codes for every unique symbol value. Or, a particular, entire Huffman code table can include Huffman codes for some subset of the unique symbol values having probabilities of occurrence that are known or predicted to fluctuate based on recent results or results with exemplary data. (Huffman codes for unique symbol values not represented in the particular table itself can be static or derived from previous tables, and may be combined with the particular table in another table.)

Compared to static Huffman encoding, adaptive Huffman encoding can result in lower bitrate for the actual data compressed by the encoding, since the probability information used to assign the Huffman codes is more accurate for the actual data. In some forms of adaptive Huffman coding (e.g., when the encoder and decoder adapt to previous data), the encoder and decoder can modify the Huffman code table in some pre-determined way according to changes in the data. On the other hand, to adapt to the actual data being Huffman encoded/decoded, the encoder transmits information specifying the Huffman code table to the decoder. This information requires additional bitrate, hurting the overall efficiency of the adaptive Huffman encoding.

B. Creating and Parameterizing Huffman Code Tables

In several respects, palettized screen capture content is different than general camera video and other kinds of content. Taking advantage of these differences, the adaptive Huffman encoder constructs a Huffman code table that can be parameterized with relatively few bits, yet still provides the most of the compression gains expected with adaptive Huffman encoding.

In palettized screen capture content, a small number of color values (often less than 10) usually predominates (in terms of probability of occurrence) in a batch of symbols. For a 800×600 frame of palettized screen capture content (480,000 pixels) with a 256-color palette, the most common color value might appear 200,000 times, the second most common value 100,000 times, the third most common value 50,000 times, on down to the least common values, which appear only a few times or not at all. For run length encoded data, symbols for short run lengths and alternative run symbols (e.g., value_above) may be much more common than other symbols.

The encoder assigns Huffman codes to the most common unique symbol values based upon the actual probabilities of occurrence for those symbol values. For the other symbol values, the encoder assigns Huffman codes of substantially equal length (rather than assigning Huffman codes based on the actual probabilities of occurrence for the other symbol symbols, which are expected to be negligible and roughly equal). The adaptive Huffman compression is slightly less efficient for the symbol values assigned without regard to actual probability of occurrence, but the encoder still achieves a large part of the compression gain possible with adaptive Huffman coding.

The encoder parameterizes the Huffman code table as the number of the most common unique symbol values and the Huffman code lengths for those symbol values. This consumes much fewer bits than sending the whole Huffman code table or sending probability or code length information for the whole Huffman code table. Overall, the bitrate gain from parameterizing the Huffman code table in this way typically outweighs any loss in efficiency due to disregarding probability statistics for some symbol values.

Figure 13:
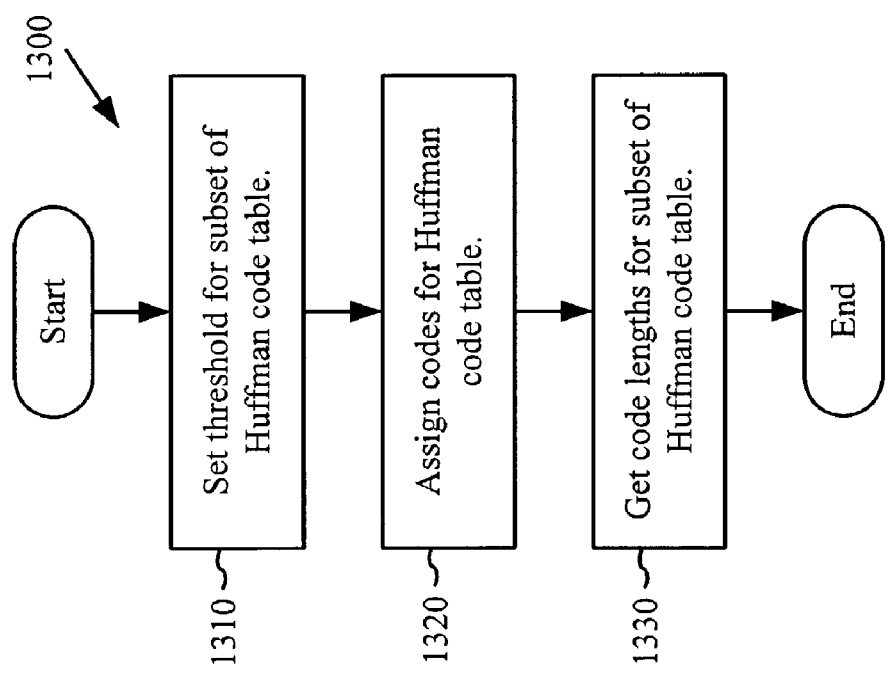

FIG. 13 shows a technique (1300) for creating a Huffman code table. An encoder such as the screen capture encoder (more precisely, the palettized region coder (320) or module therein) described with reference to FIG. 3 performs the technique (1300). In several respects, the technique (1300) is well suited for run length encoded palettized screen capture content. Alternatively, however, some other encoder performs the technique (1300) to create a Huffman code table for run length encoded palettized screen capture content or another kind of content.

With the technique (1300), the encoder creates a new Huffman code table for a batch of symbols. For screen capture video, the batch of symbols is for a frame of palettized screen capture content or for some other portion screen capture video.

The encoder sets (1310) a threshold for the Huffman code table. The threshold separates a subset of the Huffman codes in the table from the other Huffman codes in the table. For example, the subset includes the most probable Huffman codes/unique symbol values, and the threshold is a pre-defined or dynamically varying count of the number of Huffman codes/unique symbol values in the subset. Or, the threshold is a pre-defined or dynamically varying threshold for probability of occurrence (in the batch of symbols) for the unique symbol values.

The encoder assigns (1320) Huffman codes for the Huffman code table. For example, for each unique symbol value in the subset, the encoder assigns a Huffman code based on the actual probability of occurrence for the unique symbol value in the data to be encoded. Accordingly, such Huffman codes have lengths that are substantially in proportion to the relative probabilities of occurrence for the respective unique symbol values. For the remaining unique symbol values, the encoder assigns Huffman codes independent of the actual probability statistics for the symbol values, starting with shorter codes available after the last Huffman code in the subset, then continuing with consecutive codes of a greater length. Accordingly, the remaining unique symbol values have Huffman codes of substantially equal length.

The encoder then parameterizes the Huffman code table, getting (1330) the code lengths for the subset of codes in the Huffman code table. Along with the Huffman encoded data itself, the encoder transmits the threshold count as well as the code lengths and identities of corresponding symbol values. From the threshold count and the Huffman code lengths, the decoder can reconstruct the entire Huffman code table.

C. Reconstructing the Huffman Code Table from Parameters

Figure 14:
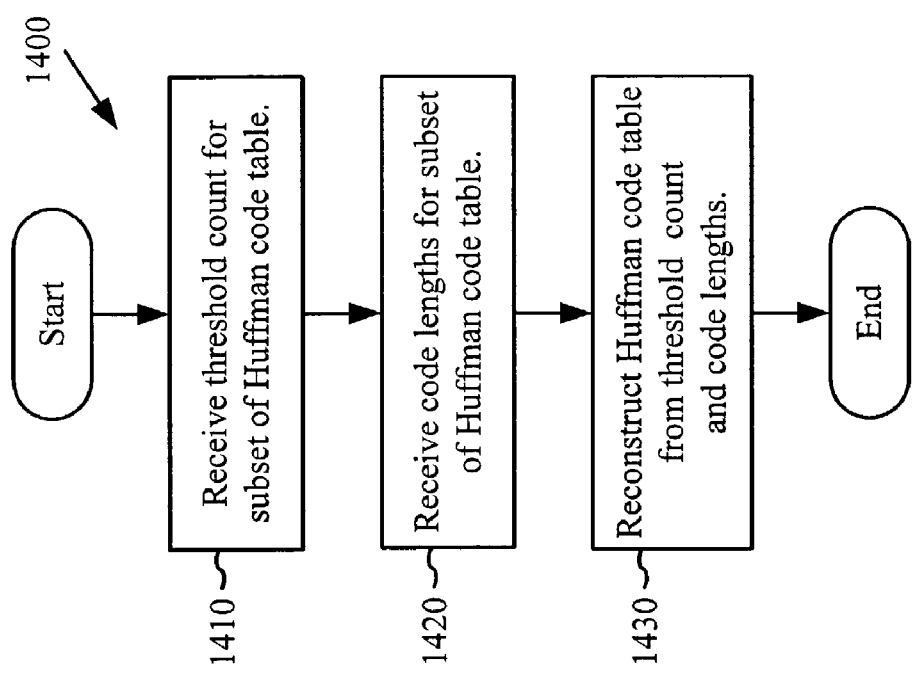
FIGS. 13 and 14 are flowcharts illustrating techniques for creating and reconstructing, respectively, a Huffman code table.

FIG. 14 shows a technique (1400) for reconstructing a Huffman code table. A decoder such as the screen capture decoder (more precisely, the palettized region decoder (420) or module therein) described with reference to FIG. 4 performs the techniques (1400). Alternatively, some other decoder performs the technique (1400) to reconstruct a Huffman code table for run length encoded palettized screen capture content or another kind of content.

With the technique (1400), a decoder reconstructs a Huffman code table for a batch of symbols. For screen capture video, the batch of symbols is for a frame of palettized screen capture content or for some other portion screen capture video.

With reference to FIG. 14, the decoder receives (1410) a threshold count for the Huffman code table. The threshold count separates a subset of the Huffman codes in the table from the other Huffman codes in the table. For example, the subset includes the most probable Huffman codes/unique symbol values, and the threshold count is the count of the number of Huffman codes/unique symbol values in the subset.

The decoder also receives (1420) code lengths for the subset of the Huffman codes in the Huffman code table. From the received threshold count and code lengths, the decoder reconstructs (1430) the Huffman code table. For example, for each Huffman code/unique symbol value in the subset, the decoder assigns a Huffman code based upon the code length received for the Huffman code/unique symbol value. For the remaining unique symbol values, the decoder assigns Huffman codes starting with shorter codes available after the last Huffman code in the subset, then continuing with consecutive codes of a greater length. So, the remaining unique symbol values have Huffman codes of substantially equal length. Thus, from the threshold count and the Huffman code lengths, the decoder reconstructs the Huffman code table, which can have Huffman codes for several hundred symbol values.

FIG. 15 shows a code listing (1500) for code for reconstructing a Huffman code table from a code count and code lengths for a subset of the codes in the table in one implementation. Alternatively, a decoder uses another algorithm to reconstruct a Huffman code table.

The decoder calls the function GenerateVLCArray( ) to reconstruct a Huffman code table. One input to the function is an array codeLen of records (each record including code length (.len) and symbol index (.sym) fields) for Huffman codes/unique symbol values in the subset. The array codeLen of records is sorted by code length. Other inputs to the function are the number nReservedSyms of Huffman codes/unique symbol values in the subset and the total number nSyms of Huffman codes/unique symbol values in the table. The function returns an array vlcArray of Huffman codes and code lengths organized by unique symbol value index.

For each Huffman code/unique symbol value in the subset (for 0 to nReservedSyms−1), the function writes the next available Huffman code of the appropriate length to the index for the symbol value in the array vlcArray of Huffman codes, and then writes the code length for the code in the next position in the array.

After assigning Huffman codes for each Huffman code/symbol value in the subset, the function determines the number of remaining Huffman codes in the table (nSyms−nReservedSyms). For positions in the array vlcArray of Huffman codes that do not already have codes/lengths, the function assigns Huffman codes and lengths. The Huffman code uses shorter codes while they last (which depends on the last Huffman code assigned for the subset), and then assigns consecutive codes starting at a greater length.

VI. RESULTS

FIGS. 16a–16g show results of run length/Huffman encoding ["RLE"] versus results of arithmetic coding ["AC"] as used in the arithmetic coding mode. The figures show results in terms of bitrate and encoding time for a set of test files.

Figure 16A:
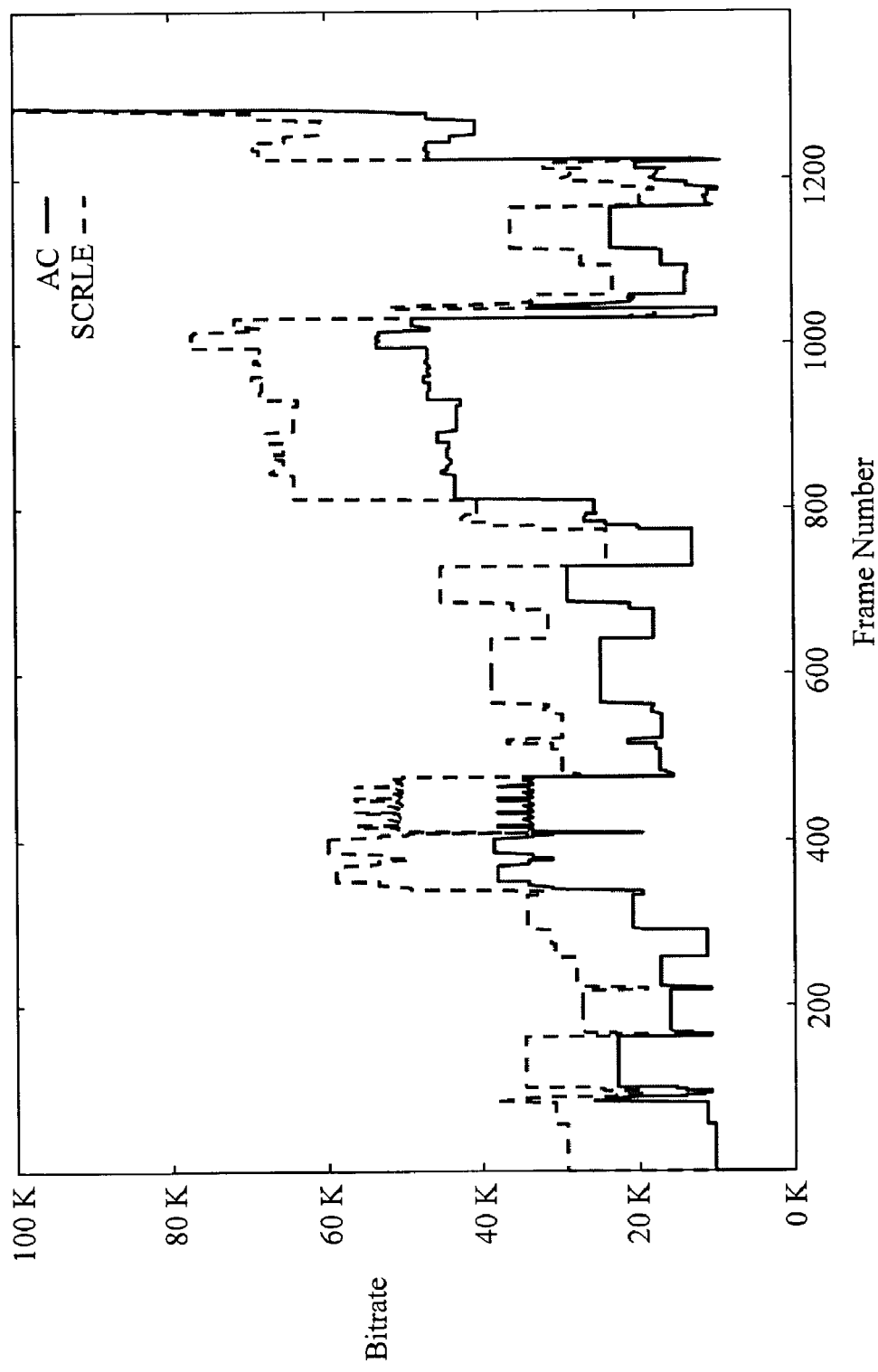
FIGS. 16a–16g are charts showing results of run length/Huffman encoding versus results of arithmetic coding for a set of test files.
Figure 16B:
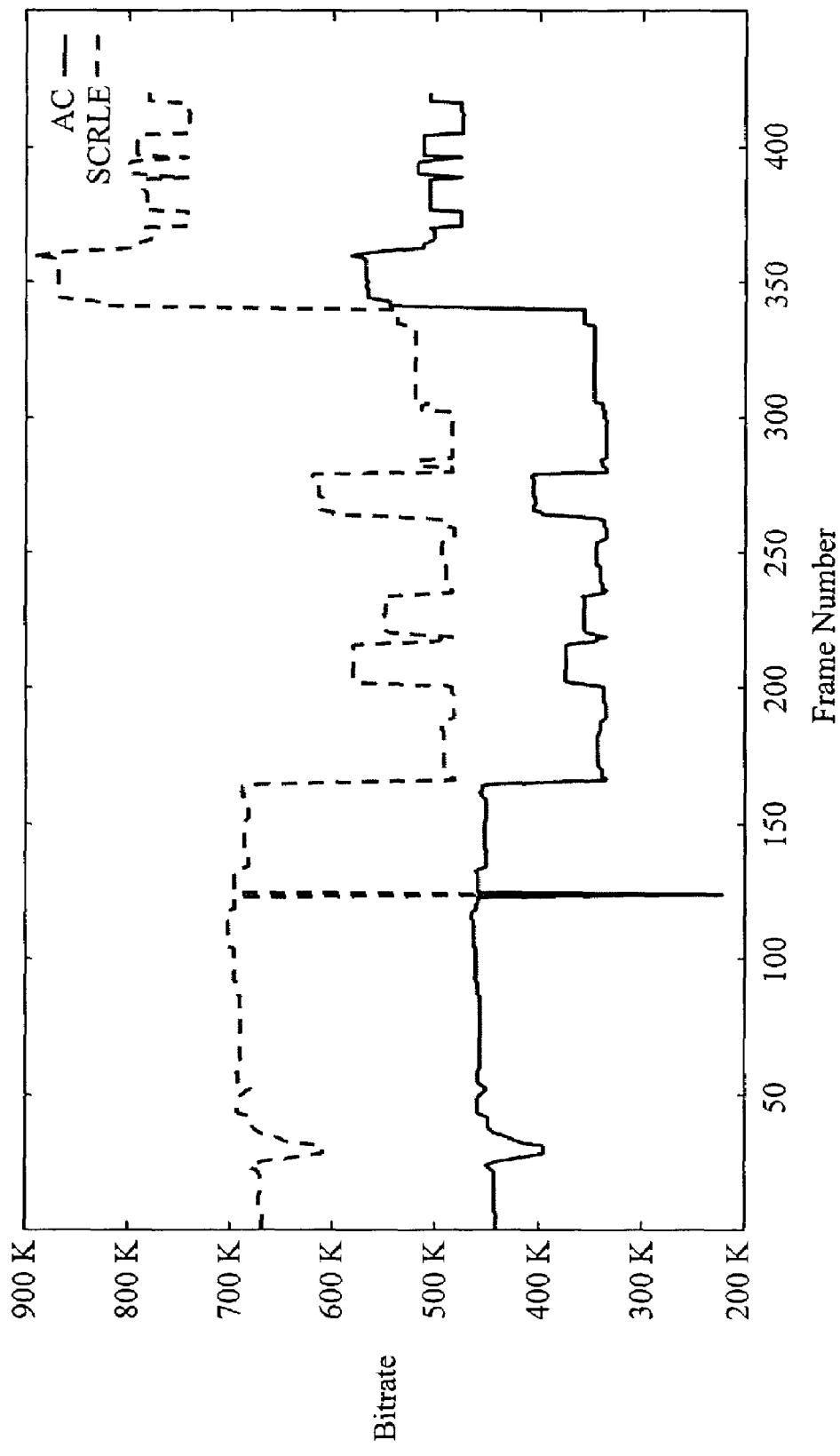
Figure 16C:
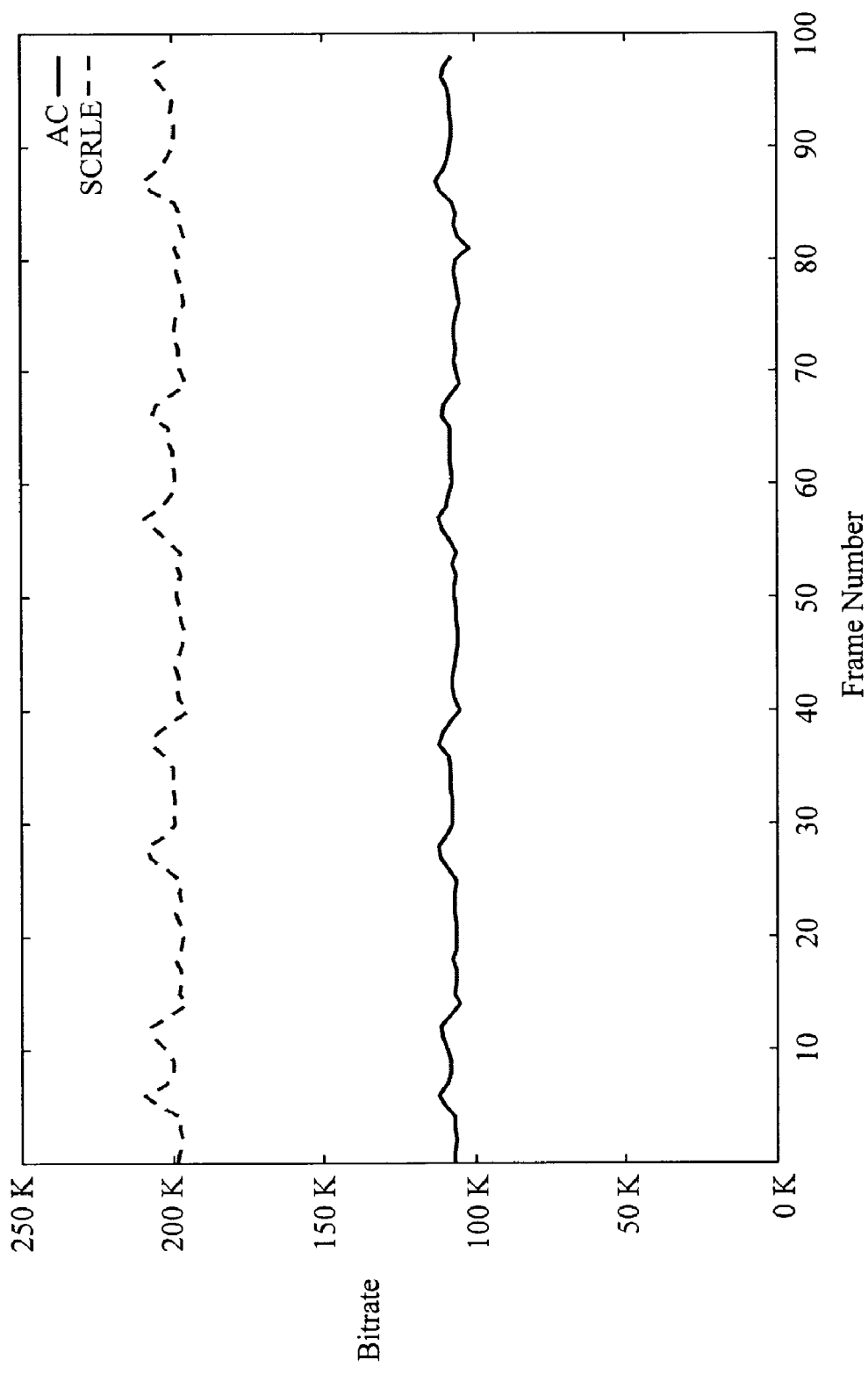
Figure 16D:
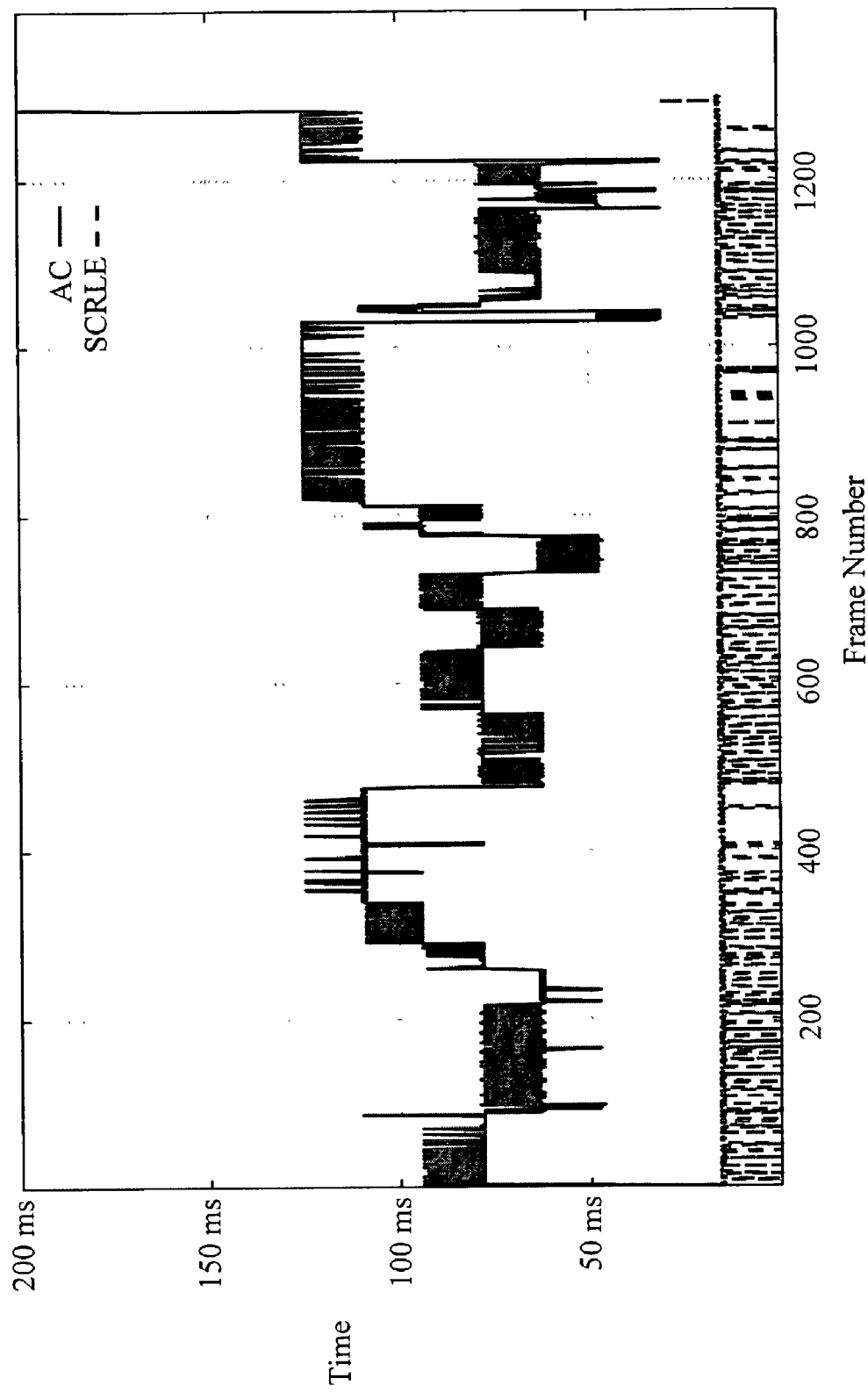
Figure 16E:
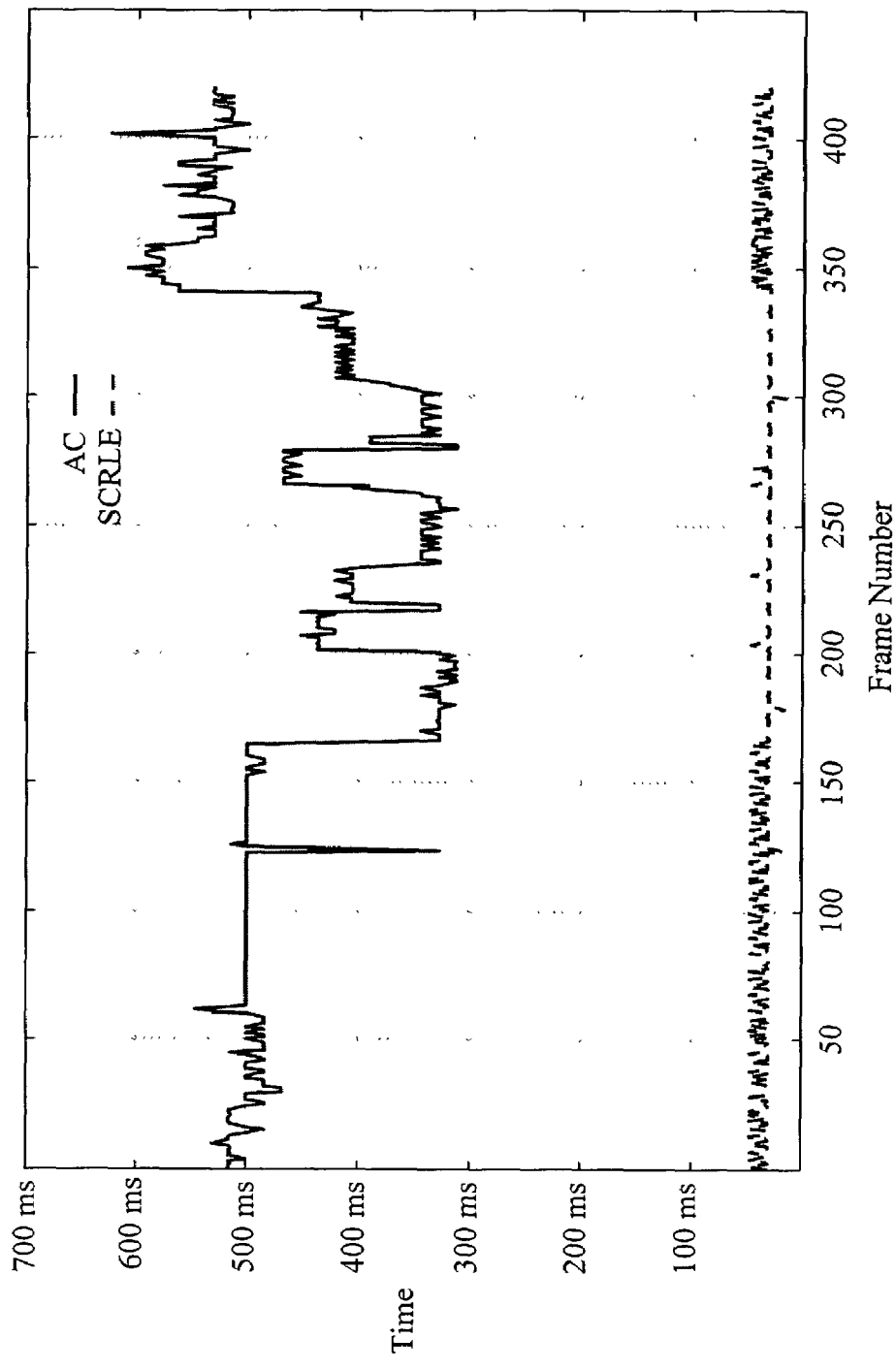
Figure 16F:
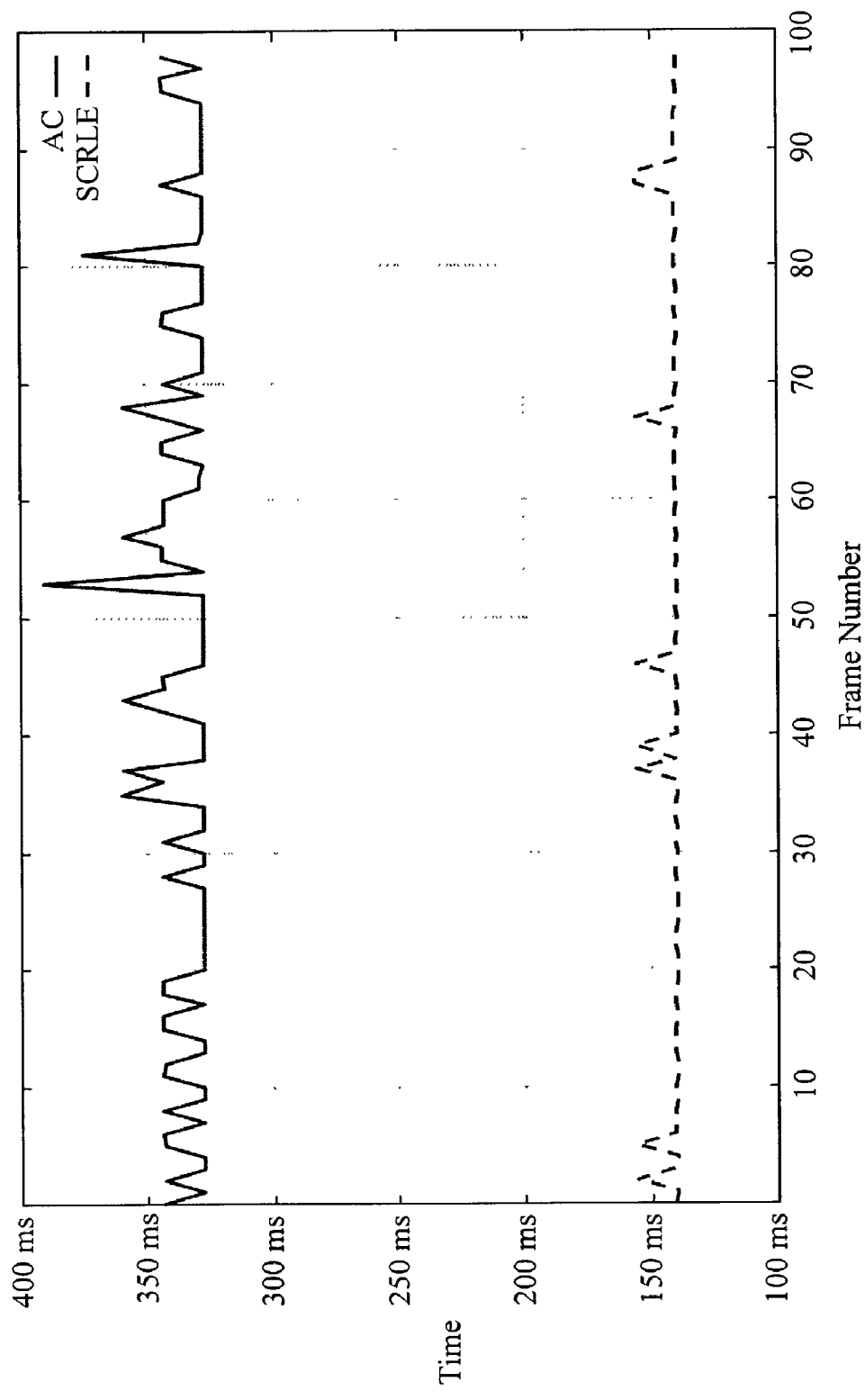
Figure 16G:
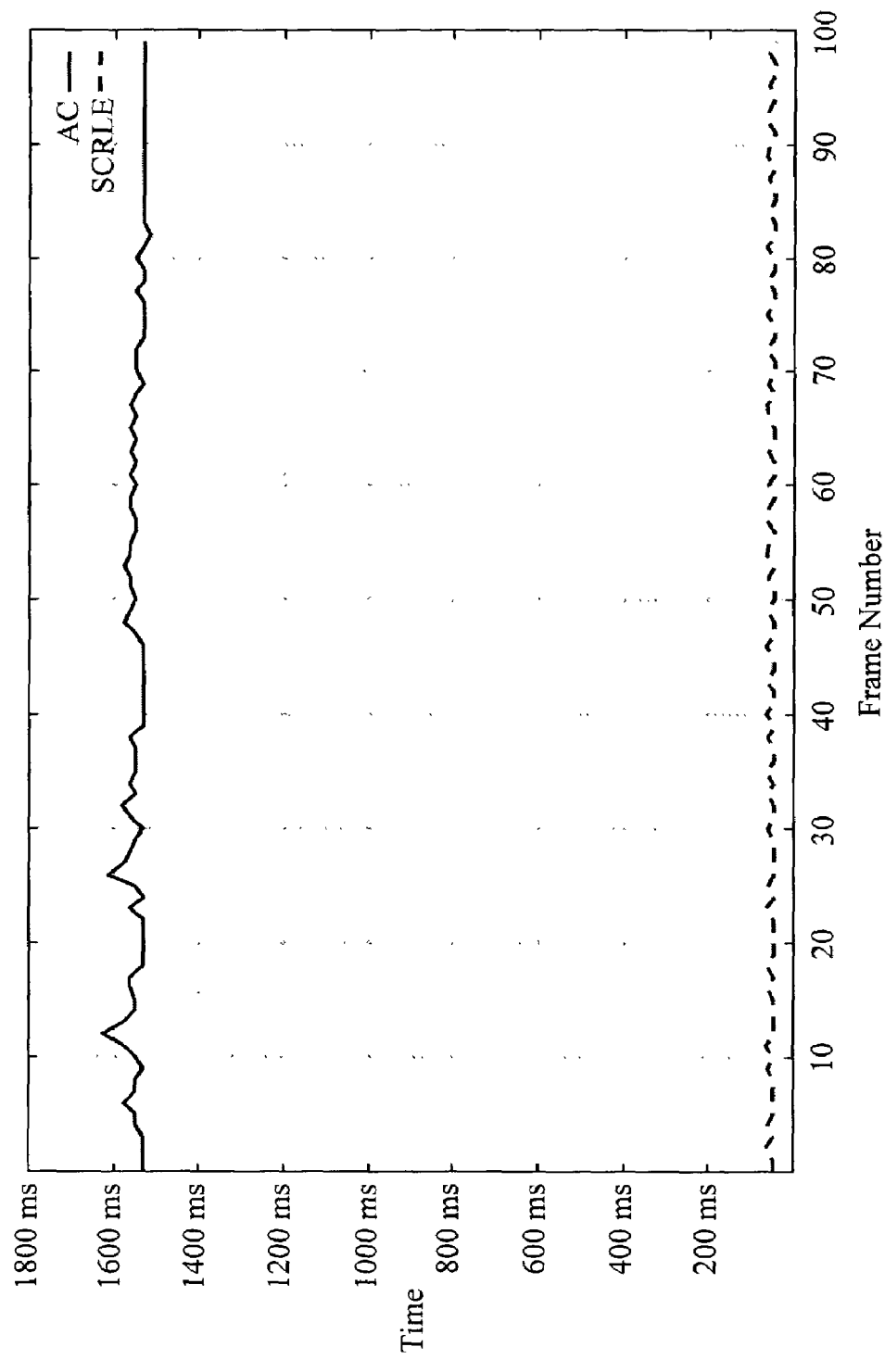

FIGS. 16a and 16d show the bitrates and encoding times, respectively, for intra-frame compression of a file of 544× 380 pixel frames using the RLE and the AC. FIGS. 16b and 16e show the same for a file of 640×480 pixel frames, and FIGS. 16c and 16f show the same for a file of 632×400 pixel frames. FIG. 16g shows the encoding times for intra-frame compression of a file of 800×600 pixel frames of random data using the RLE and the AC.

While the per-frame bitrates and encoding times depend on a variety of factors including frame size and complexity of the content, FIGS. 16a–16g show several trends. The bitrate for frames compressed using the AC is consistently 40–60% lower than the bitrate for frames compressed using the RLE. (The RLE does provide 150% better compression than other prior art run length encoding techniques that are not adapted to palettized screen capture content.)

On the other hand, the encoding time is typically 2–20 times faster with the RLE than with the AC. The encoding time with the RLE is fast in absolute terms (usually under 0.15 seconds per frame, often much less). Moreover, the encoding time with the RLE is relatively consistent.

Having described and illustrated the principles of my invention with reference to various described embodiments, it will be recognized that the described embodiments can be modified in arrangement and detail without departing from such principles. It should be understood that the programs, processes, or methods described herein are not related or limited to any particular type of computing environment, unless indicated otherwise. Various types of general purpose or specialized computing environments may be used with or perform operations in accordance with the teachings described herein. Elements of the described embodiments shown in software may be implemented in hardware and vice versa.

In view of the many possible embodiments to which the principles of my invention may be applied, I claim as my invention all such embodiments as may come within the scope and spirit of the following claims and equivalents thereto.

I claim:

1. A screen capture encoder comprising:
 a run length encoder for encoding plural runs of symbols for pixels of screen capture content, each of the plural runs encoded as a run value and a run length, wherein the run value for at least one of the plural runs is a color value symbol, and wherein the run value for at least one of the plural rums is an above color value symbol; and
 a module for adaptively assigning plural Huffman codes to results of the encoding, wherein the module parameterizes the plural Huffman codes as a Huffman code threshold and lengths for less than all of the plural Huffman codes, thereby reducing associated bitrate for the plural Huffman codes.

2. The screen capture encoder of claim 1 wherein the run value for at least one of the plural runs is a previous frame color value symbol.

3. The screen capture encoder of claim 1 further comprising:
 means for selectively using a second encoder instead of the run length encoder.

4. A computer-readable medium storing computer-executable instructions for causing a computer system programmed thereby to perform a method comprising:
 decoding plural run length encoded pixel series for a frame of screen capture content, each of the plural series encoded as a run length and a run value, wherein a first run value for a first series of the plural series is a color value for each pixel in the first series, wherein a second run value for a second series of the plural series is an adjacent pixel marker for each pixel in the second series, and wherein the decoding includes using one or more color values of an adjacent pixel series for the second series.

5. The computer-readable medium of claim 4 wherein the adjacent pixel marker is an adjacent row marker, and wherein the adjacent pixel series is spatially adjacent the second series within the frame of screen capture content.

6. The computer-readable medium of claim 4 wherein the adjacent pixel marker is an adjacent frame marker, and wherein the adjacent pixel series is temporally adjacent the second series.

7. A computer-readable medium storing computer-executable instructions for causing a computer system programmed thereby to perform a method comprising:
   creating a variable length code table for a set of plural unique symbol values, the table including a set of plural variable length codes, wherein a threshold separates the set of plural variable length codes into a first group of one or more of the plural variable length codes and a second group of one or more of the plural variable length codes, the one or more variable length codes in the first group having lengths based at least in part upon probability of occurrence of corresponding unique symbol values;
   parameterizing the table as the threshold and the lengths for the one or more variable length codes in the first group, thereby reducing bitrate associated with the table.

8. The computer-readable medium of claim 7 wherein the threshold is a count of the one or more variable length codes in the first group, and wherein the one or more variable length codes of the second group have substantially equal lengths.

9. The computer-readable medium of claim 7 further comprising, during an encoding session, repeating the creating and the parameterizing for adaptive encoding.

10. A computer-readable medium storing computer-executable instructions for causing a computer system programmed thereby to perform a method of creating a Huffman code table for a set of n unique symbol values, the method comprising:
    setting a Huffman code count m, where m is less than n;
    for each of m unique symbol values in the set, generating a different Huffman code with a length substantially in proportion to probability of occurrence for the unique symbol value;
    for each of n minus m remaining unique symbol values in the set, generating a different Huffman code of substantially equal length; and
    parameterizing the table as the Huffman code count and the m lengths, thereby reducing bitrate associated with the table.

11. The computer-readable medium of claim 10 wherein the probability of occurrence is probability of occurrence in content to be encoded with the table, whereby the table adapts to the content to be encoded.

12. A computer-readable medium storing computer-executable instructions for causing a computer system programmed thereby to perform a method comprising:
    receiving a code count and one or more code lengths, wherein the code count separates a set of plural variable length codes into a first group of one or more of the plural variable length codes and a second group of one or more of the plural variable length codes, wherein the one or more code lengths are for the one or more variable length codes in the first group; and
    reconstructing a variable length code table for all of the set of plural variable length codes from the code count and the one or more code lengths.

13. The computer-readable medium of claim 12 further comprising, during a decoding session, repeating the receiving and the reconstructing for adaptive decoding.

14. A computer-readable medium storing computer-executable instructions for causing a computer system programmed thereby to perform a method of reconstructing a Huffman code table for a set of n unique symbol values, the method comprising:
    receiving a Huffman code count m, where m is less than n;
    receiving m Huffman code lengths for m different Huffman codes;
    for each of m unique symbol values in the set, generating a different Huffman code having the received Huffman code length for the different Huffman code;
    for each of n minus m remaining unique symbol values in the set, generating a different Huffman code of substantially equal length.

15. The computer-readable medium of claim 14, wherein the method further comprises, during a decoding session, repeating the reconstructing for each of one or more additional Huffman code tables for adaptive decoding.

* * * * *

UNITED STATES PATENT AND TRADEMARK OFFICE
CERTIFICATE OF CORRECTION

PATENT NO. : 7,016,547 B1
APPLICATION NO. : 10/186639
DATED : March 21, 2006
INVENTOR(S) : Sergey Smirnov It is certified that error appears in the above-identified patent and that said Letters Patent is hereby corrected as shown below:

On page 2, item (56), under "Other Publications", in column 2, line 28, after "Sep. 24, 2001" delete ",".

In column 26, line 39, in Claim 1, delete "rums" and insert -- runs --, therefor.

Signed and Sealed this

Eighteenth Day of August, 2009

David J. Kappos
*Director of the United States Patent and Trademark Office*